(12) United States Patent
Lee et al.

(10) Patent No.: US 10,340,212 B2
(45) Date of Patent: Jul. 2, 2019

(54) SEMICONDUCTOR PACKAGE STRUCTURE HAVING A HEAT DISSIPATION STRUCTURE

(71) Applicant: Advanced Semiconductor Engineering, Inc., Kaohsiung (TW)

(72) Inventors: Chih Cheng Lee, Kaohsiung (TW); Yu-Lin Shih, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/824,913

(22) Filed: Nov. 28, 2017

(65) Prior Publication Data
US 2019/0164871 A1    May 30, 2019

(51) Int. Cl.
| | |
|---|---|
| H01L 23/49 | (2006.01) |
| H01L 23/36 | (2006.01) |
| H01L 23/495 | (2006.01) |
| H01L 23/42 | (2006.01) |
| H01L 23/367 | (2006.01) |
| H01L 21/56 | (2006.01) |
| H01L 23/498 | (2006.01) |

(52) U.S. Cl.
CPC ...... H01L 23/49568 (2013.01); H01L 21/568 (2013.01); H01L 23/3677 (2013.01); H01L 23/42 (2013.01); H01L 23/49822 (2013.01); H01L 23/49838 (2013.01); H01L 2224/16225 (2013.01); H01L 2224/16227 (2013.01); H01L 2924/181 (2013.01)

(58) Field of Classification Search
CPC ........... H01L 23/49568; H01L 23/3677; H01L 23/42; H01L 23/49822; H01L 23/49838
See application file for complete search history.

(56) References Cited

U.S. PATENT DOCUMENTS

| | | | |
|---|---|---|---|
| 6,525,429 B1* | 2/2003 | Kovac | H01L 21/56 174/259 |
| 6,998,533 B2* | 2/2006 | De Samber | B81B 7/007 174/521 |
| 7,180,745 B2* | 2/2007 | Mandel | H01L 21/4878 361/719 |
| 8,034,665 B2* | 10/2011 | Haba | H01L 21/4853 438/121 |
| 2009/0159315 A1 | 6/2009 | Fukuoka | |
| 2015/0168514 A1* | 6/2015 | Albrecht | H03F 3/211 324/322 |
| 2017/0162471 A1* | 6/2017 | Dahlstrom | H01L 23/3735 |
| 2017/0223871 A1* | 8/2017 | Sylvestre | H01L 23/34 |
| 2017/0358556 A1* | 12/2017 | Bitz | H01L 25/0657 |

* cited by examiner

*Primary Examiner* — Ida M Soward
(74) *Attorney, Agent, or Firm* — Foley & Lardner LLP; Cliff Z. Liu

(57) ABSTRACT

A semiconductor substrate includes a dielectric layer, a heat dissipation structure and a first patterned conductive layer. The dielectric layer has a surface. The heat dissipation structure is surrounded by the dielectric layer. The heat dissipation structure defines a space and includes a liquid in the space. The first patterned conductive layer is disposed adjacent to the surface of the dielectric layer and thermally connected with the heat dissipation structure.

23 Claims, 41 Drawing Sheets

SEMICONDUCTOR PACKAGE STRUCTURE HAVING A HEAT DISSIPATION STRUCTURE

BACKGROUND

1. Technical Field

The present disclosure relates to a semiconductor device package and a method of manufacturing the same. In particular, the present disclosure relates to a semiconductor device package including an improved semiconductor substrate.

2. Description of the Related Art

A high power chip in a semiconductor device package may cause a high temperature in the semiconductor device package. Therefore, a good thermal transmission path in the semiconductor device package for heat sinking is desired.

SUMMARY

In one or more embodiments, a semiconductor substrate includes a dielectric layer, a heat dissipation structure and a first patterned conductive layer. The dielectric layer has a surface. The heat dissipation structure is surrounded by the dielectric layer. The heat dissipation structure defines a space and includes a liquid in the space. The first patterned conductive layer is disposed adjacent to the surface of the dielectric layer and in contact with, or otherwise thermally connected with, the heat dissipation structure.

In one or more embodiments, a semiconductor package structure includes a first substrate and a chip. The first substrate includes a dielectric layer, a heat dissipation structure and a first patterned conductive layer. The dielectric layer has a surface. The heat dissipation structure is surrounded by the dielectric layer. The heat dissipation structure defines a space and includes a liquid in the space. The first patterned conductive layer is disposed adjacent to the surface of the dielectric layer and in contact with, or otherwise thermally connected with, the heat dissipation structure. The chip is disposed on the first substrate and electrically and thermally connected to the first patterned conductive layer.

In one or more embodiments, a method for manufacturing a semiconductor substrate includes providing a carrier; forming a patterned block on the carrier for defining a space of a heat dissipation structure; forming a dielectric layer on the patterned block and the carrier; removing the carrier and forming a heat dissipation structure within the space; and filling a liquid into the heat dissipation structure and sealing the heat dissipation structure.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated by such arrangement.

Figure 1:
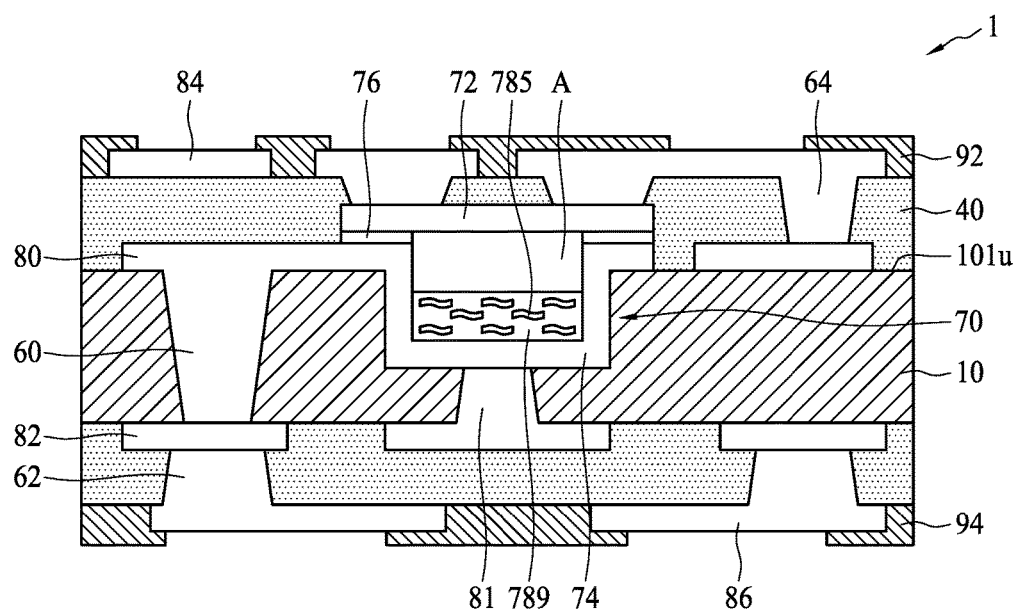
FIG. 1 is a cross-sectional view of a semiconductor substrate in accordance with some embodiments of the present disclosure.

FIG. 1 is a cross-sectional view of a semiconductor substrate 1 in accordance with some embodiments of the present disclosure. The semiconductor substrate 1 includes a dielectric layer 10, an enclosed/hermetic heat dissipation structure 70, patterned conductive layers 80, 82, 84 and 86, conductive vias 60, 62 and 64, an insulation layer 40 and protection layers 92 and 94.

In some embodiments, the dielectric layer 10 includes Polypropylene (PP), Polyimide (PI), Ajinomoto Build-up Film (ABF), or other suitable insulating materials. In some embodiments, the insulation layer 40 includes PP, PI, ABF or other suitable insulating materials. The patterned conductive layer 80 includes a conductive via 60. The patterned conductive layer 82 includes a conductive via 62. The patterned conductive layer 84 includes a conductive via 64. In some embodiments, the patterned conductive layers 80, 82, 84 and 86 and the conductive vias 62, 60 and 64 may include, for example, copper (Cu), or other metal, or a metal alloy, or other conductive material. In some embodiments, the protection layers 92 and 94 may include solder mask layers. The protection layer 92 is disposed on the patterned conductive layer 84 and the insulation layer 40, and exposes portions of the patterned conductive layer 84. The protection layer 94 is disposed on the patterned conductive layer 86 and exposes portions of the patterned conductive layer 86.

The dielectric layer 10 has a surface 101*u*. The heat dissipation structure 70 is surrounded by the dielectric layer 10. The heat dissipation structure 70 defines a space A and includes a working liquid 789 in the space A. In some embodiments, the liquid 789 includes one or more of water, alcohols, ketones (e.g., acetone) and ammonia. A surface within the space A of the heat dissipation structure 70 includes a capillary structure, a porous surface, a non-planar surface, or a rough surface. In some embodiments, the liquid 789 is an inorganic liquid or an organic liquid, and a boiling point of the liquid 789 is no greater than, or lower than, about 100 Degrees Celsius (° C.), such as about 95° C. or less, about 85° C. or less, or about 75° C. or less. In some embodiments, a pressure within the space A is no greater than, or lower than, about 1 atm, such as about 0.95 atm or less, about 0.85 atm or less, or about 0.75 atm or less.

The patterned conductive layer 80 and a portion of the heat dissipation structure 70 are integrally formed to be a one-piece structure or a monolithic structure. The patterned conductive layer 80 and a portion of the heat dissipation structure 70 are formed to be a one-piece structure so as to provide higher effect for heat sinking. The patterned conductive layer 80 is disposed adjacent to the surface 101*u* and in contact with the heat dissipation structure 70. The insulation layer 40 is disposed on the surface 101*u* and the patterned conductive layer 80, the patterned conductive layer 84 is disposed on the insulation layer 40, and the vias 64 extend through the insulation layer 40 to connect to the patterned conductive layer 80. The heat dissipation structure 70 includes an upper portion 72, a lower portion 74 and an adhesive layer 76 disposed between the upper portion 72 and the lower portion 74. In some embodiments, the adhesive layer 76 may include an adhesive material, an organic material or an inorganic material or other suitable materials. In some embodiments, a material of the heat dissipation structure 70 may include, for example, Cu, or other metal, or a metal alloy, or other conductive material. In some embodiments, the space A of the heat dissipation structure 70 includes a plurality of objects 785 selected from Cu mesh, Cu fiber, sintered metal powder, or combinations of two or more thereof. The plurality of objects 785 within the enclosed/hermetic heat dissipation structure 70 may provide higher capillary effects for heat sinking. The patterned conductive layer 84 may absorb the heat generated from other electronic components. The patterned conductive layer 84 may transmit the heat to a heat absorbing end (not shown) of the heat dissipation structure 70 through the via 64. The liquid within the heat dissipation structure 70 will convert into a vapor state after absorbing the heat. Next, the vapor within the heat dissipation structure 70 flows to a cooling end (not shown) of the heat dissipation structure 70. In some embodiments, the heat of the vapor may be transmitted to the external environment through the patterned conductive layers 80, 82 and 86 and the vias 60 and 62 at the cooling end. After the heat sinking, the vapor will convert back into the liquid state and the liquid flows back to the heat absorbing end through a capillary structure.

The enclosed/hermetic heat dissipation structure 70 is directly disposed in and surrounded by the dielectric layer 10 without an additional adhesive layer. In some embodiments, the enclosed/hermetic heat dissipation structure 70 may be used to transmit heat and/or current. The capillary structure within the space A of the heat dissipation structure 70 may provide the heat sinking through the liquid flowing in the capillary structure. The pressure of the space A is no greater than, or lower than, about 1 atm so that the boiling point of the liquid is no greater than, or lower than, about 100° C.

Figure 2:
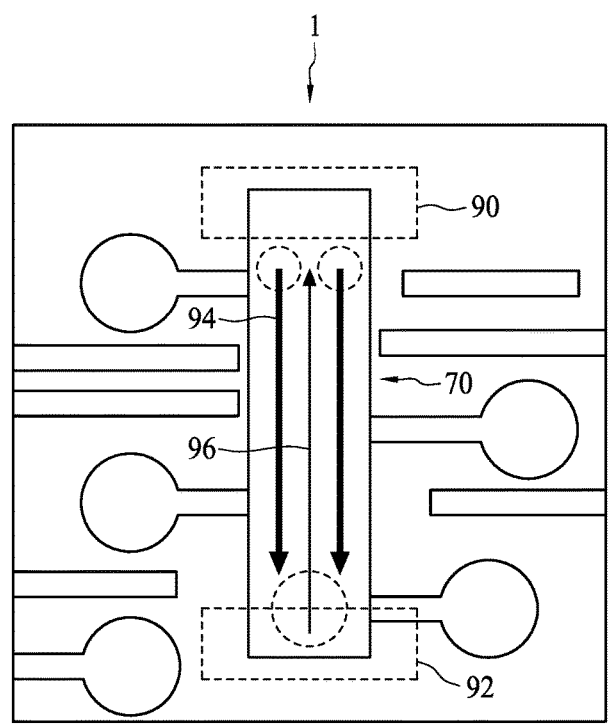
FIG. 2 is a schematic diagram of a top view of the semiconductor substrate as shown in FIG. 1 in accordance with some embodiments of the present disclosure.

FIG. 2 is a schematic diagram of a top view of the semiconductor substrate 1 as shown in FIG. 1 in accordance with some embodiments of the present disclosure. The heat dissipation structure 70 includes a heat absorbing end 90 and a cooling end 92 opposite to the heat absorbing end 90. A working liquid 789 is within the heat dissipation structure 70. The liquid 789 at the heat absorbing end 90 may be heated to a vapor state. The arrow 94 represents the vapor flow direction within the heat dissipation structure 70. The vapor within the heat dissipation structure 70 will flow to the cooling end 92 after absorbing the heat. The heat of the vapor may be transmitted to the external environment at the cooling end 92 and the vapor will be condensed into a liquid state. Next, the liquid 789 will flow back to the heat absorbing end 90 through the capillary structure within the heat dissipation structure 70. A heat transmitting cycle is completed after the liquid 789 flows back to the heat absorbing end 90. In some embodiments, the patterned conductive layer 82 is thermally connected to the cooling end 92 of the heat dissipation structure 70 through the via 62 of the patterned conductive layer 82 (see FIG. 1). In some embodiments, the patterned conductive layer 84 is thermally connected to the heat absorbing end 90 of the heat dissipation structure 70 through the conductive via 64 of the patterned conductive layer 84.

Figure 3:
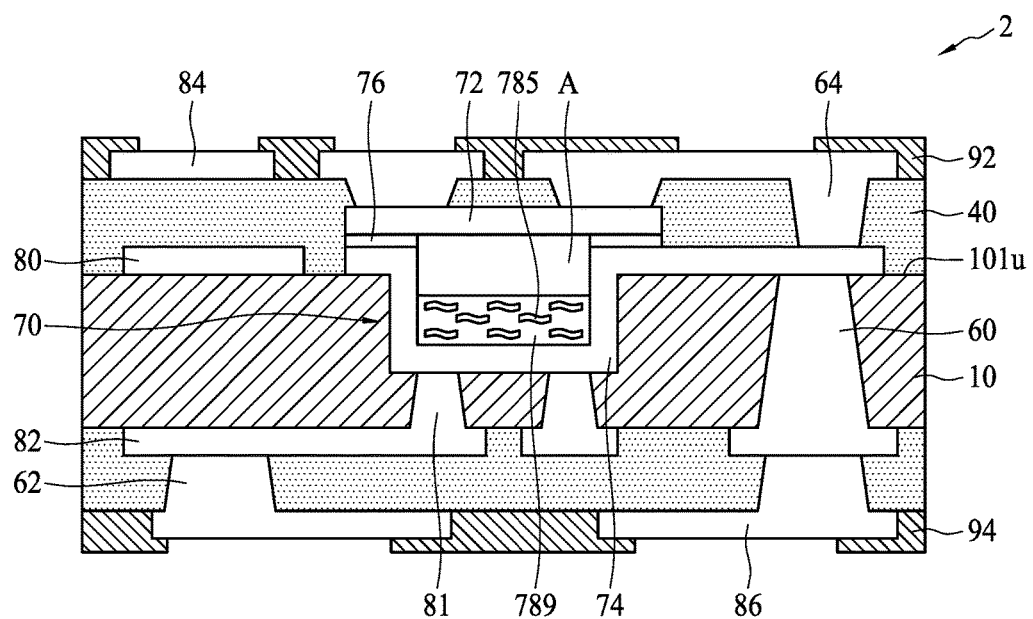
FIG. 3 is a cross-sectional view of a semiconductor substrate in accordance with some embodiments of the present disclosure.

FIG. 3 is a cross-sectional view of a semiconductor substrate 2 in accordance with some embodiments of the present disclosure. The semiconductor substrate 2 is similar to the semiconductor substrate 1 of FIG. 1, and certain details of same-numbered components are not described again with respect to FIG. 3. The semiconductor substrate 2 includes a dielectric layer 10, an enclosed/hermetic heat dissipation structure 70, patterned conductive layers 80, 82, 84 and 86, conductive vias 60, 62 and 64, an insulation layer 40 and protection layers 92 and 94. The patterned conductive layer 80 includes a conductive via 60. The patterned conductive layer 82 includes a conductive via 62. The patterned conductive layer 84 includes a conductive via 64.

The patterned conductive layer 80 and a portion of the heat dissipation structure 70 are integrally formed to be a one-piece structure or a monolithic structure. The patterned conductive layer 84 is thermally connected with the patterned conductive layer 80 through the via 64. The patterned conductive layer 80 is thermally connected with the patterned conductive layer 82 through the via 60.

Figure 4A:
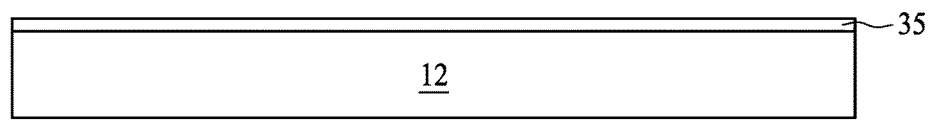
FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M, FIG. 4N, FIG. 4O, FIG. 4P, FIG. 4Q, and FIG. 4R illustrate some embodiments of a method of manufacturing the semiconductor substrate of FIG. 1.
Figure 4B:
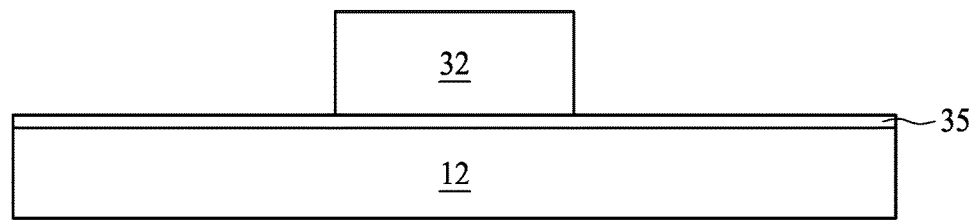
Figure 4C:
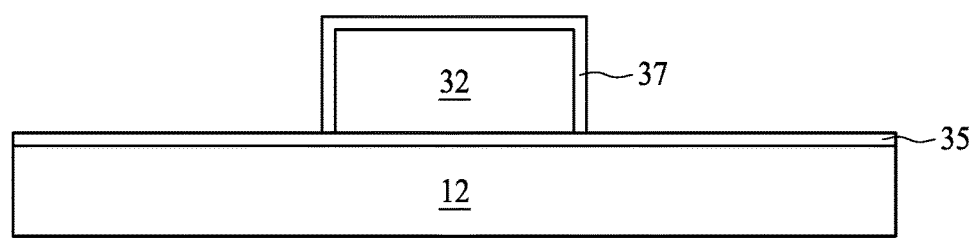
Figure 4D:
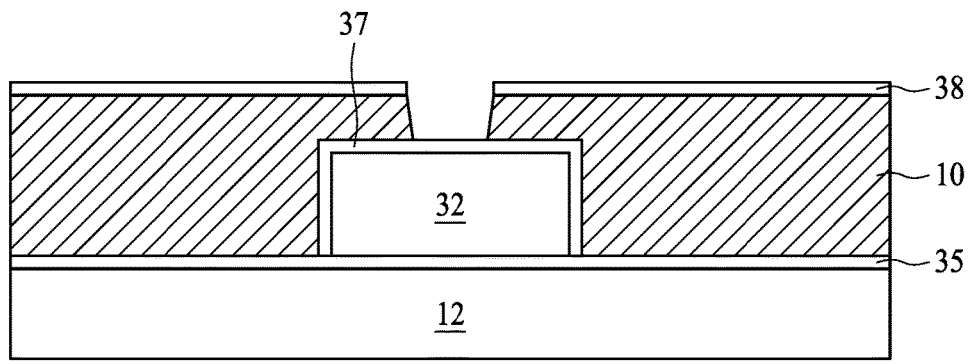
Figure 4E:
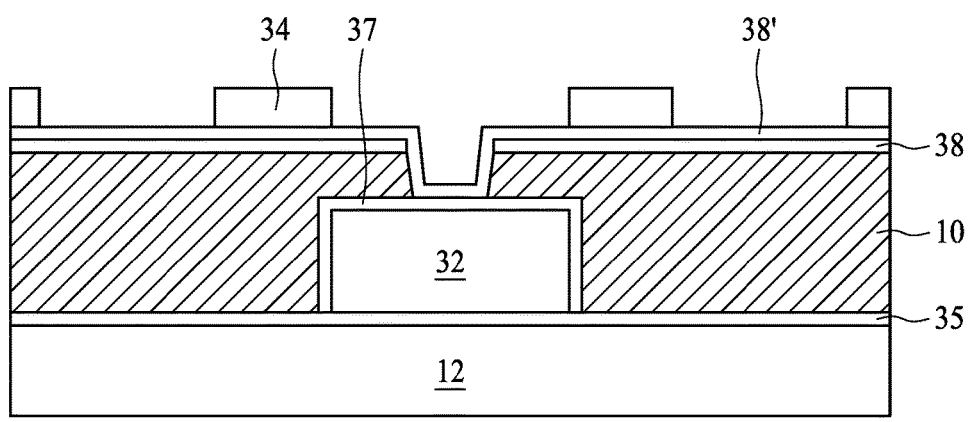
Figure 4F:
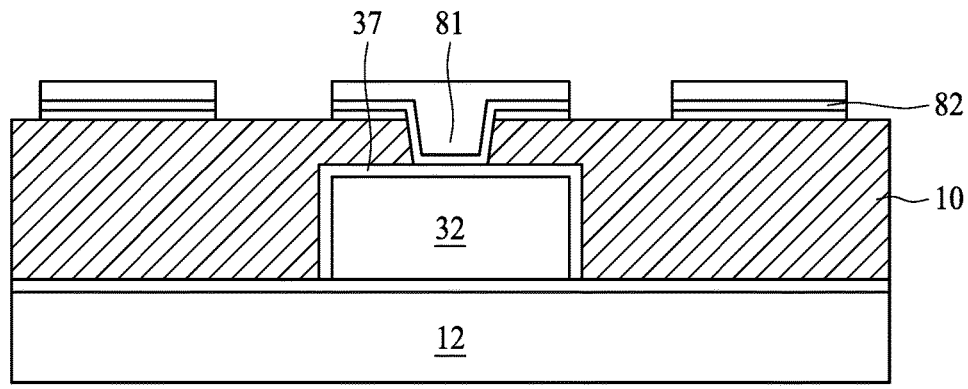
Figure 4G:
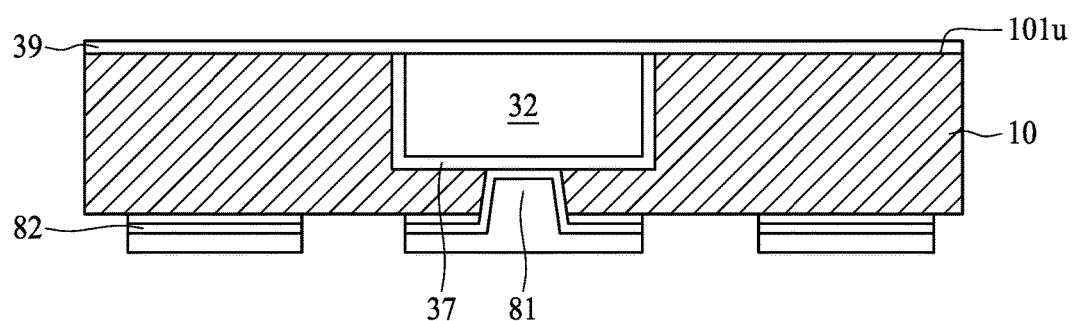
Figure 4H:
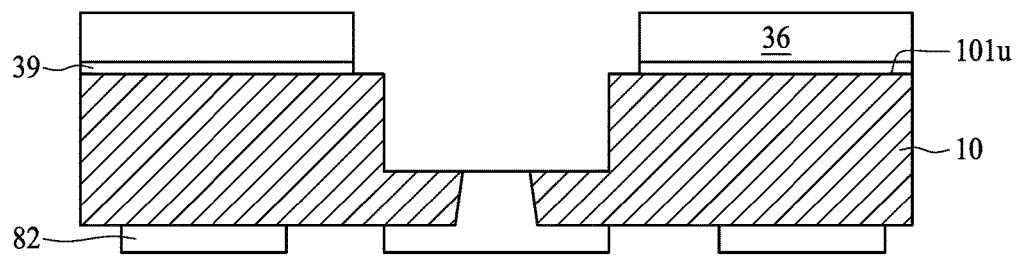
Figure 4I:
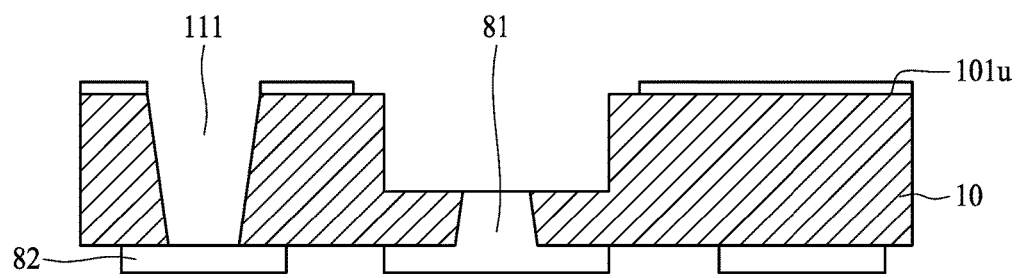
Figure 4J:
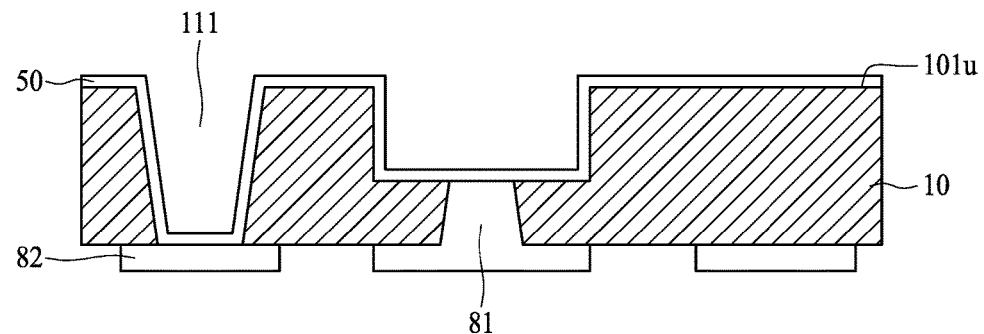
Figure 4K:
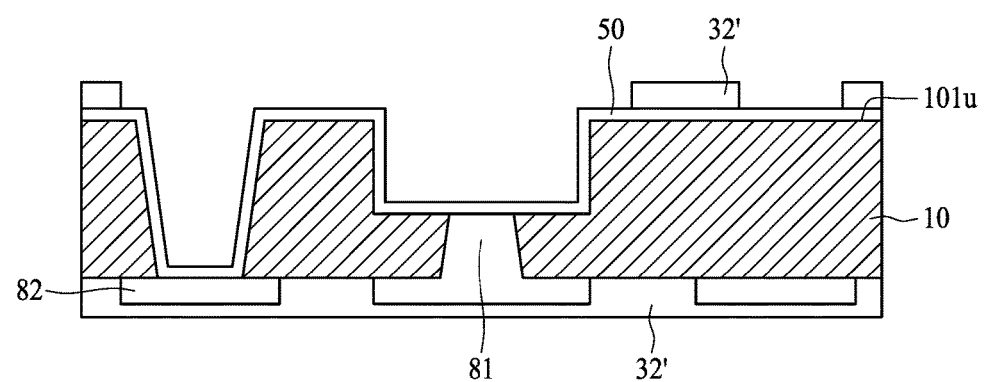
Figure 4L:
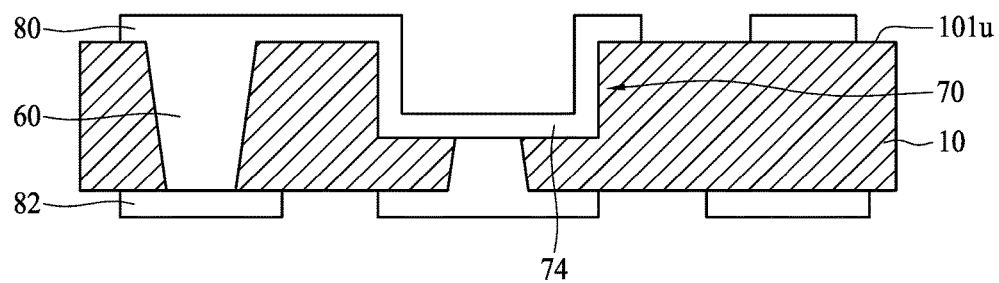
Figure 4M:
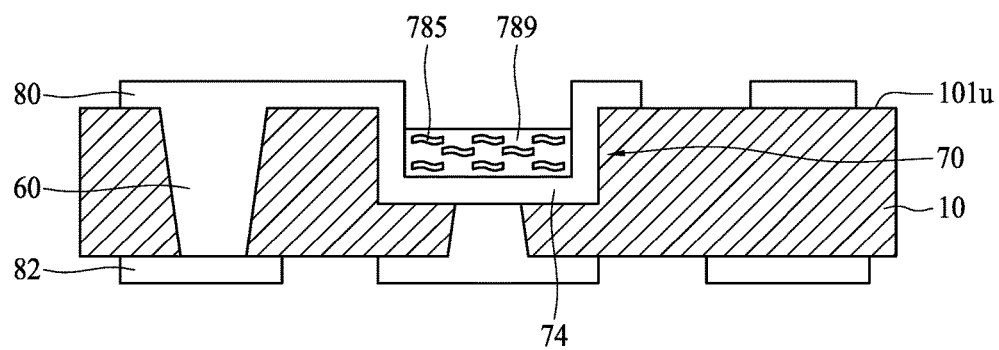
Figure 4N:
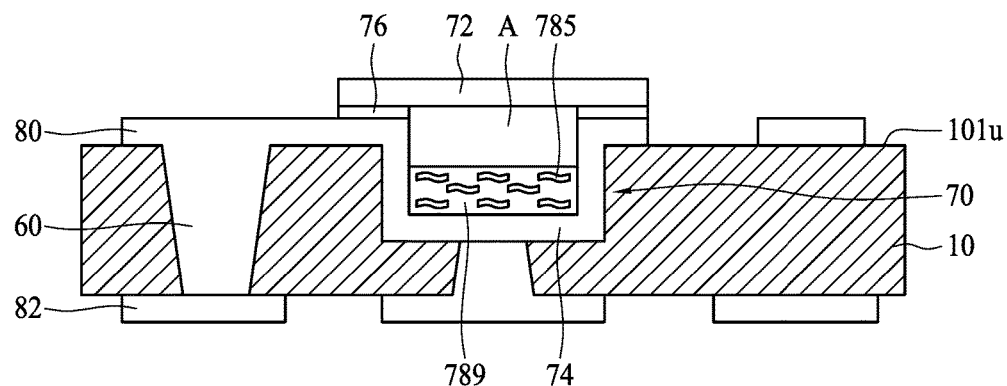
Figure 4O:
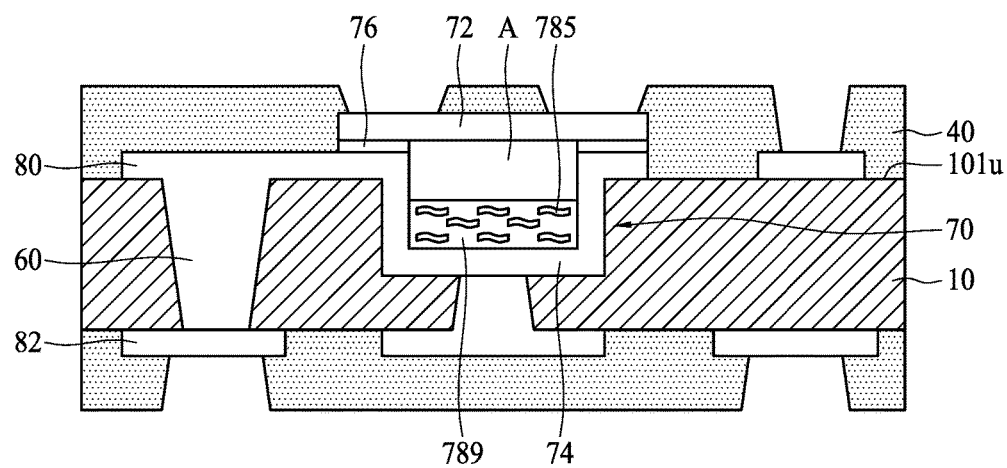
Figure 4P:
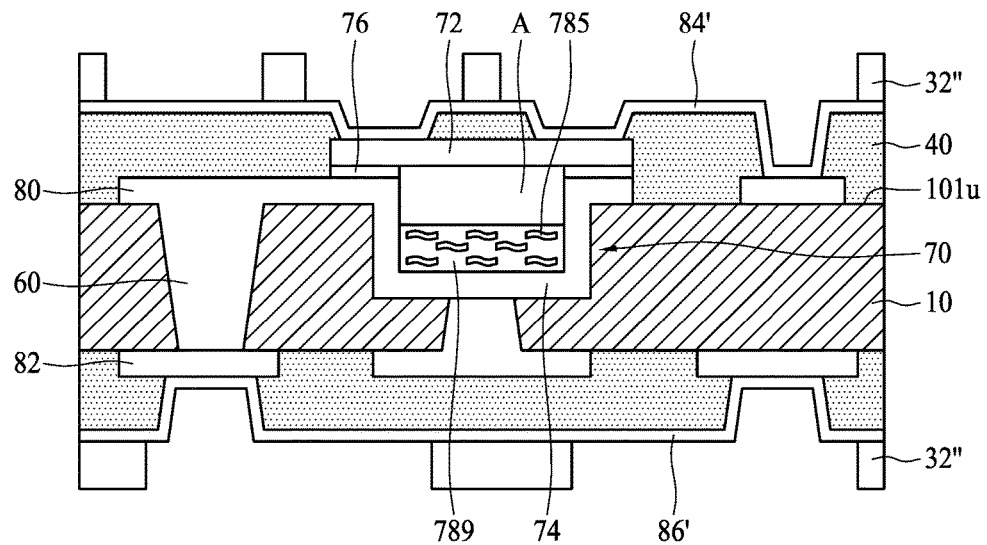
Figure 4Q:
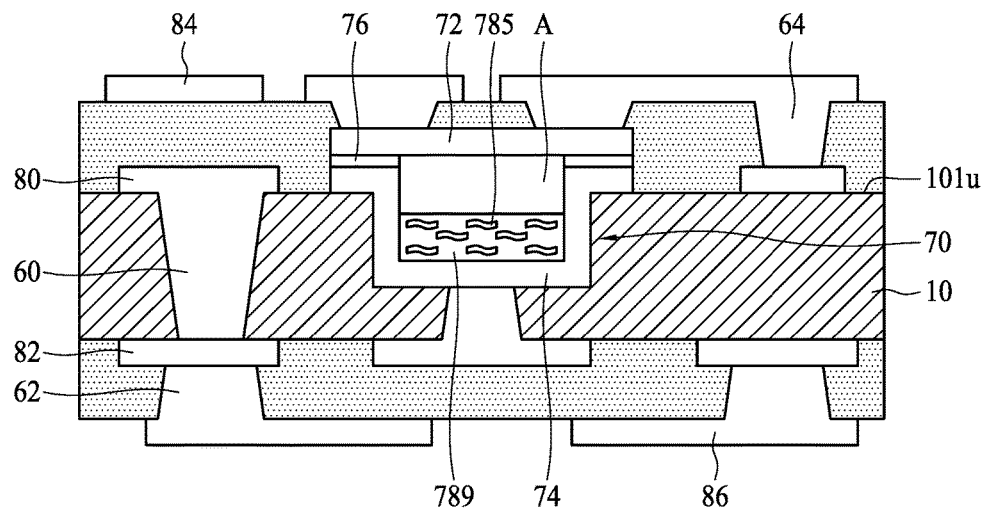
Figure 4R:
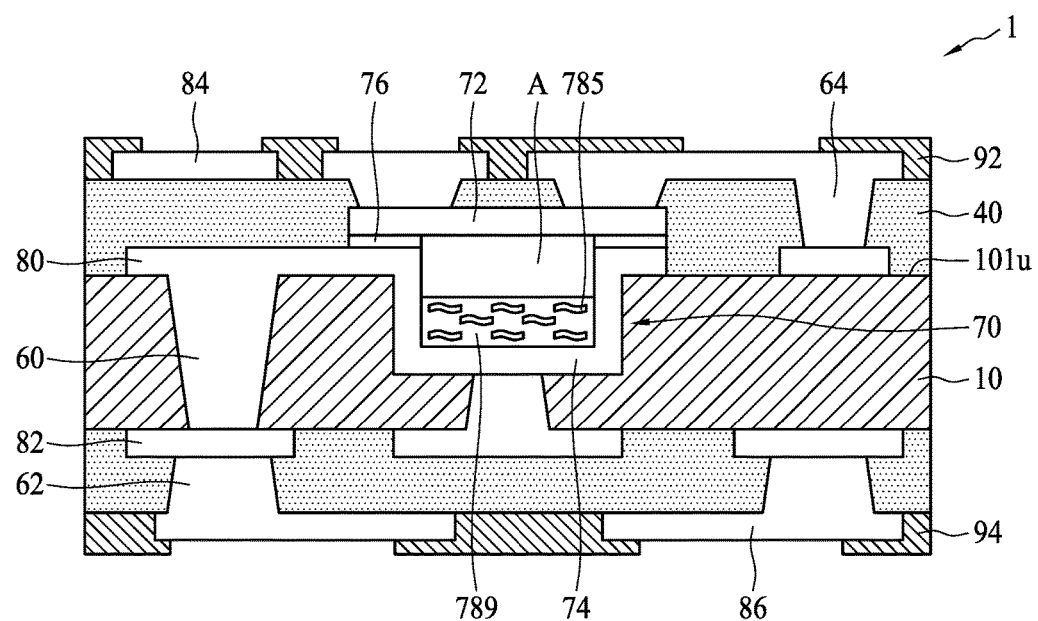

FIGS. 4A-4R illustrate some embodiments of a method of manufacturing the semiconductor substrate 1 of FIG. 1. Referring to FIG. 4A, a carrier 12 is provided. A seed layer 35 is disposed or formed on the carrier 12. In some embodiments, the seed layer 35 may include, for example, Cu, or other metal, or a metal alloy, or other conductive material.

Referring to FIG. 4B, a patterned photo resist layer 32 is disposed or formed on the seed layer 35. In some embodiments, the patterned photo resist layer 32 may include, for example, a photosensitive material, a positive polyimide, a positive or negative photoresist or other suitable materials.

Referring to FIG. 4C, a seed layer 37 is disposed or formed to cover the patterned photo resist layer 32. In some embodiments, the seed layer 37 may include, for example, Cu, or other metal, or a metal alloy, or other conductive material. A top surface and a side wall of the patterned photo resist layer 32 are covered by the seed layer 37.

Referring to FIG. 4D, a dielectric layer 10 is disposed or formed on the patterned photo resist layer 32 and the carrier 12. In some embodiments, the dielectric layer 10 includes PP, PI, ABF, or other suitable insulating materials. The dielectric layer 10 has or defines an opening. A metal layer 38 is disposed or formed on the dielectric layer 10. In some embodiments, the metal layer 38 may include, for example, Cu, or other metal, or a metal alloy, or other conductive material.

Referring to FIG. 4E, a seed layer 38' is disposed or formed on the metal layer 38. A patterned photo resist layer 34 is formed on the seed layer 38'. In some embodiments, the patterned photo resist layer 34 may include, for example, a photosensitive material, a positive polyimide, a positive or negative photoresist or other suitable materials.

Referring to FIG. 4F, a patterned conductive layer 82 is disposed or formed on the dielectric layer 10. A via 81 and the patterned conductive layer 82 are formed by a plating operation. The patterned photo resist layer 34 and underlying portions of the seed layer 38' and the metal layer 38 are removed. In some embodiments, a material of the via 81 and the patterned conductive layer 82 may include, for example, Cu, or other metal, or a metal alloy, or other conductive material.

Referring to FIG. 4G, the carrier 12 is removed. Next, a seed layer 39 is disposed or formed on a surface 101$u$ of the dielectric layer 10. In some embodiments, the seed layer 39 may include, for example, Cu, or other metal, or a metal alloy, or other conductive material.

Referring to FIG. 4H, a patterned photo resist layer 36 is disposed or formed on the seed layer 39. In some embodiments, the patterned photo resist layer 36 may include, for example, a photosensitive material, a positive polyimide, a positive or negative photoresist or other suitable materials. The patterned photo resist layer 32 and the seed layer 37 are removed. A portion of the seed layer 39 is removed. In some embodiments, the seed layer 37 may be retained without removing.

Referring to FIG. 4I, the patterned photo resist layer 36 is removed. An opening 111 is formed by etching.

Referring to FIG. 4J, a seed layer 50 is disposed or formed on the dielectric layer 10. The seed layer 50 covers a side wall and a bottom surface of the opening 111. The seed layer 50 covers the via 81. In some embodiments, the seed layer 50 may include, for example, Cu, or other metal, or a metal alloy, or other conductive material.

Referring to FIG. 4K, a patterned photo resist layer 32' is disposed or formed on seed layer 50 and covers the patterned conductive layer 82. In some embodiments, the patterned photo resist layer 32' may be, for example, a photosensitive material, a positive polyimide, a positive or negative photoresist or other suitable materials.

Referring to FIG. 4L, a patterned conductive layer 80, a via 60 and a lower portion 74 of a heat dissipation structure 70 are formed by plating. In some embodiments, the via 60 and the lower portion 74 of the heat dissipation structure 70 may include, for example, Cu, or other metal, or a metal alloy, or other conductive material. In some embodiments, forming the lower portion 74 includes forming a surface within the lower portion 74 by using a chemical solution to treat the surface within the lower portion 74, so that the surface within the lower portion 74 includes a capillary structure, a porous surface, a non-planar surface, or a rough surface. Next, the patterned photo resist layer 32' and underlying portions of the seed layer 50 are removed.

Referring to FIG. 4M, a working liquid 789 is filled into the lower portion 74 of the heat dissipation structure 70. In some embodiments, the liquid 789 includes one or more of water, alcohols, ketones (e.g., acetone) and ammonia. The surface within the lower portion 74 of the heat dissipation structure 70 includes a capillary structure, a porous surface, a non-planar surface, or a rough surface. In some embodiments, a plurality of objects 785 selected from Cu mesh, Cu fiber, sintered metal powder, or combinations of two or more thereof are filled into the lower portion 74 of the heat dissipation structure 70.

Referring to FIG. 4N, an upper portion 72 of the heat dissipation structure 70 is disposed on the lower portion 74 through an adhesive layer 76. In some embodiments, the adhesive layer 76 may include an adhesive material, an organic material or an inorganic material or other suitable materials. The space A is enclosed/sealed after disposing the upper portion 72. After sealing the space A, the heat dissipation structure 70 is obtained. A pressure within the heat dissipation structure 70 is no greater than, or lower than, about 1 atm. In some embodiments, the operations of forming the heat dissipation structure 70 includes forming a heat absorbing end 90 and a cooling end 92 opposite to the heat absorbing end 90 (see FIG. 2). In some embodiments, the patterned conductive layer 80 is thermally connected to the heat dissipation structure 70. In some embodiments, the patterned conductive layer 82 is thermally connected to the cooling end 92 of the heat dissipation structure 70 through the via 60 of the patterned conductive layer 80.

Referring to FIG. 4O, an insulation layer 40 is disposed or formed on the dielectric layer 10 and covers the patterned conductive layers 80 and 82 and a portion of the heat dissipation structure 70. In some embodiments, the dielectric layer 10 includes PP, PI, ABF, or other suitable insulating materials. The dielectric layer 10 has or defines openings.

Referring to FIG. 4P, a seed layer 84' and a seed layer 86' are disposed or formed on the insulation layer 40. A patterned photo resist layer 32" is disposed or formed on the seed layer 84' and the seed layer 86'. In some embodiments, the seed layer 84' and the seed layer 86' may include, for example, Cu, or other metal, or a metal alloy, or other conductive material.

Referring to FIG. 4Q, patterned conductive layers 84 and 86 and vias 62 and 64 are formed by plating. In some embodiments, the patterned conductive layers 84 and 86 and the vias 62 and 64 may include, for example, Cu, or other metal, or a metal alloy, or other conductive material. In some embodiments, the patterned conductive layer 84 is thermally connected with the heat absorbing end 90 of the heat dissipation structure 70 through the via 64 of the patterned conductive layer 84.

Referring to FIG. 4R, a protection layer 92 is disposed on the patterned conductive layer 84 and a protection layer 94 is disposed on the patterned conductive layer 86. Portions of the patterned conductive layers 84 and 86 are exposed. In some embodiments, the protection layers 92 and 94 may be solder mask layers. After the protection layers 92 and 94 are disposed, the semiconductor substrate 1 of FIG. 1 is obtained.

Figure 5A:
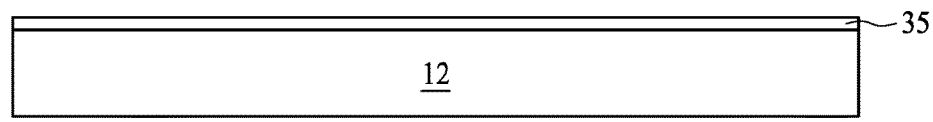
FIG. 5A, FIG. 5B, FIG. 5C, FIG. 5D, FIG. 5E, FIG. 5F, FIG. 5G, FIG. 5H, FIG. 5I, FIG. 5J, FIG. 5K, FIG. 5L, FIG. 5M, FIG. 5N, FIG. 5O, FIG. 5P, FIG. 5Q, FIG. 5R, FIG. 5S, FIG. 5T, FIG. 5U, FIG. 5V, FIG. 5W and FIG. 5X illustrate a method of manufacturing a semiconductor substrate in accordance with some embodiments of the present disclosure.
Figure 5B:
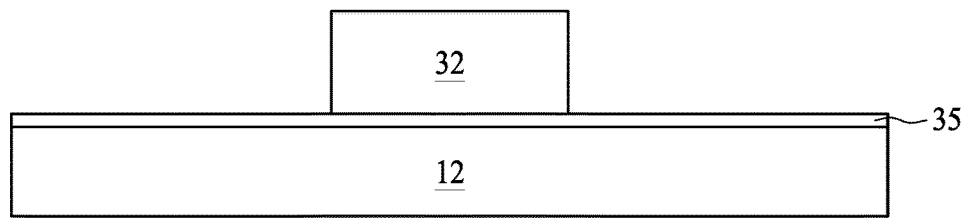
Figure 5C:
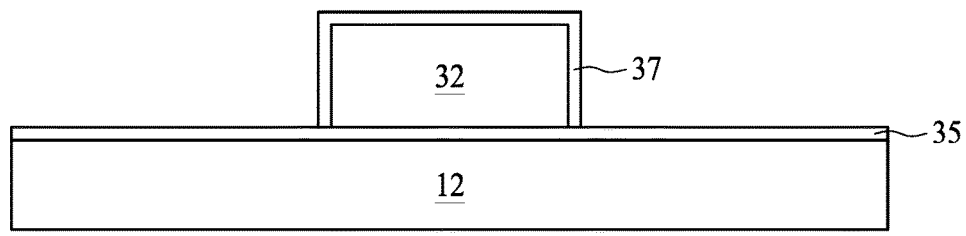
Figure 5D:
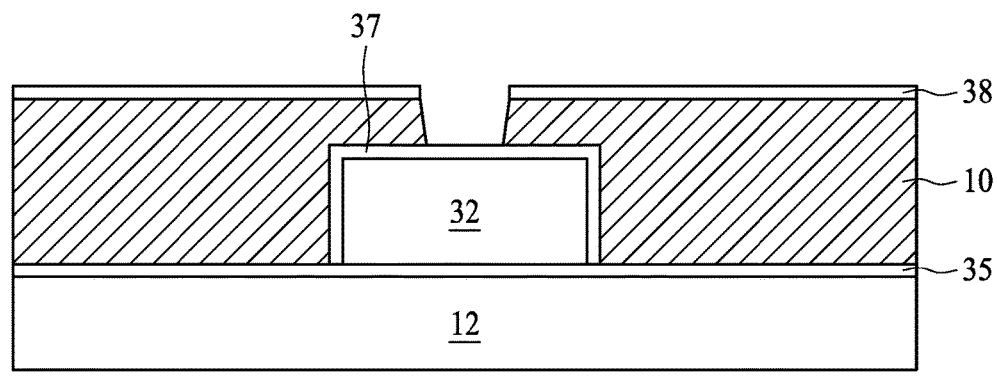
Figure 5E:
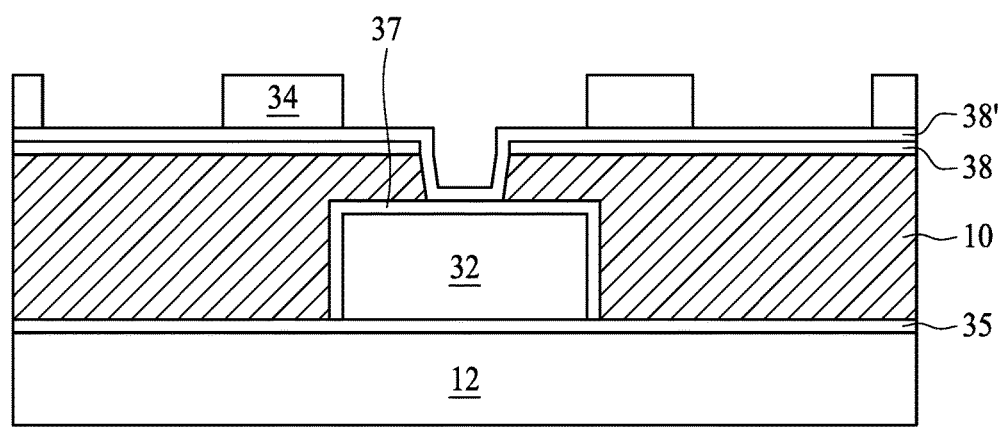
Figure 5F:
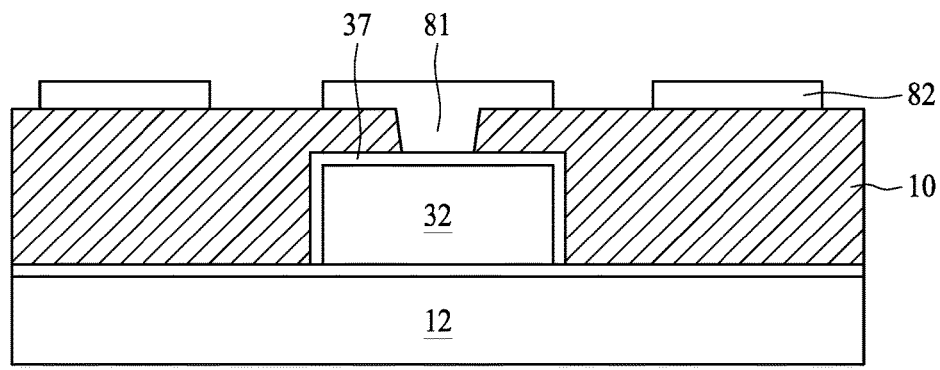
Figure 5G:
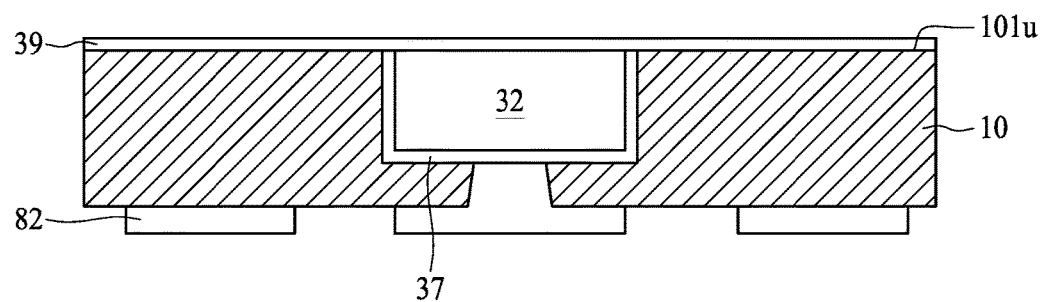
Figure 5H:
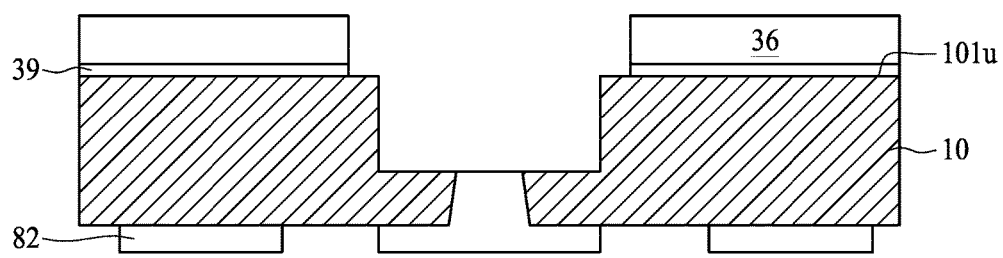
Figure 5I:
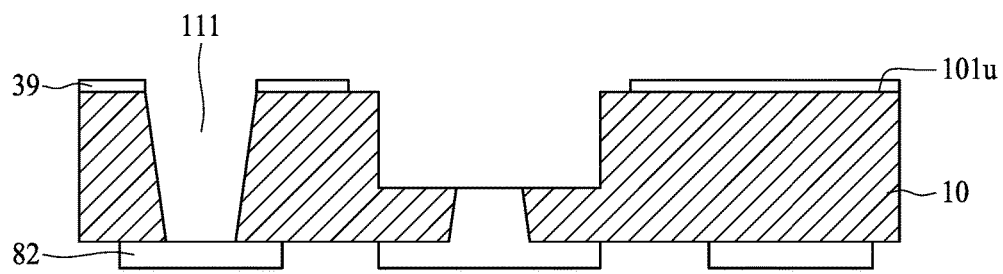
Figure 5J:
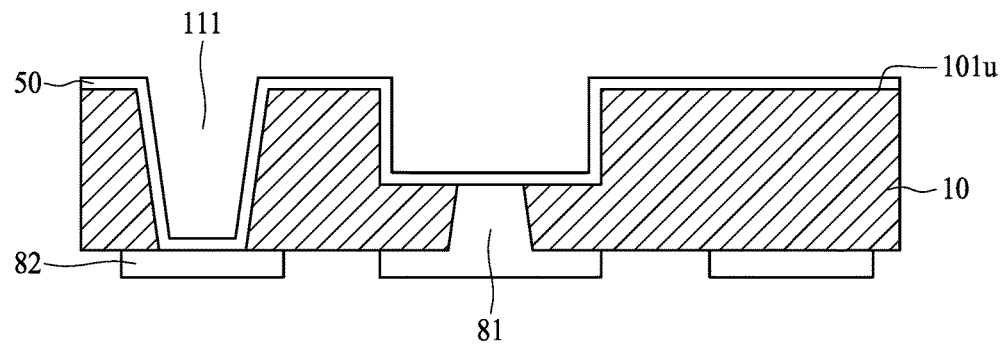
Figure 5K:
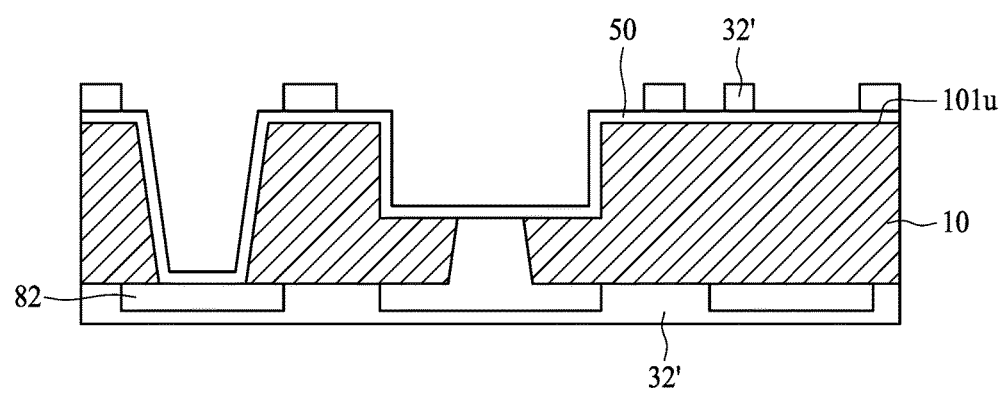
Figure 5L:
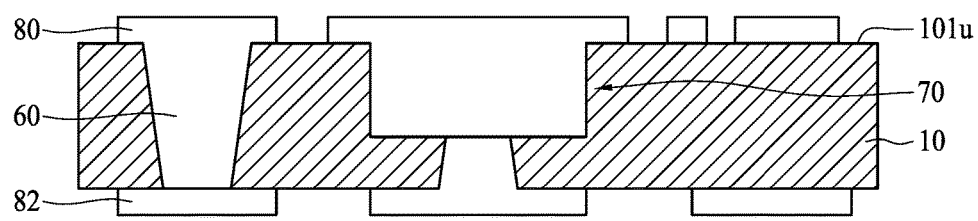
Figure 5M:
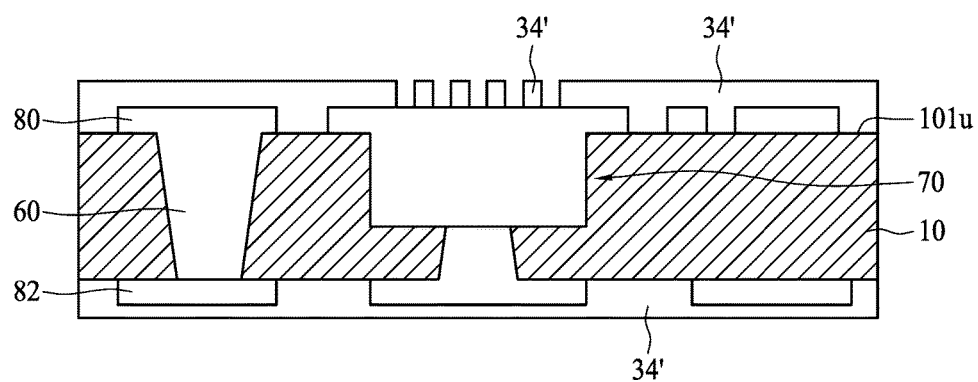
Figure 5N:
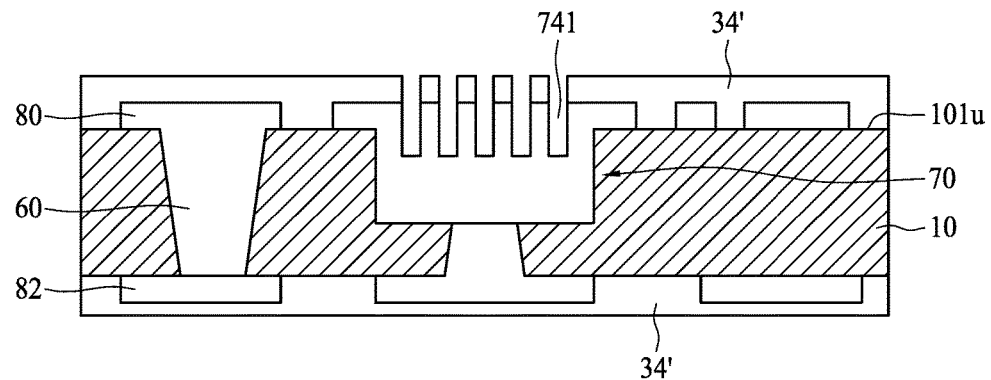
Figure 5O:
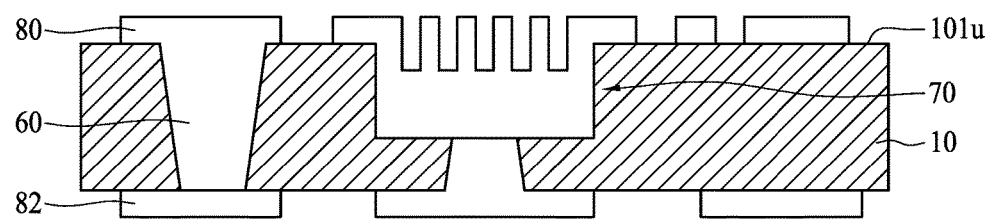
Figure 5P:
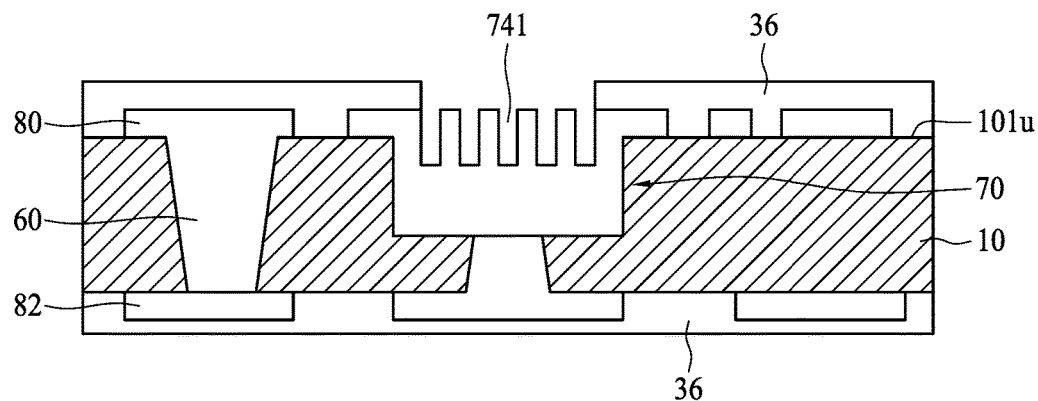
Figure 5Q:
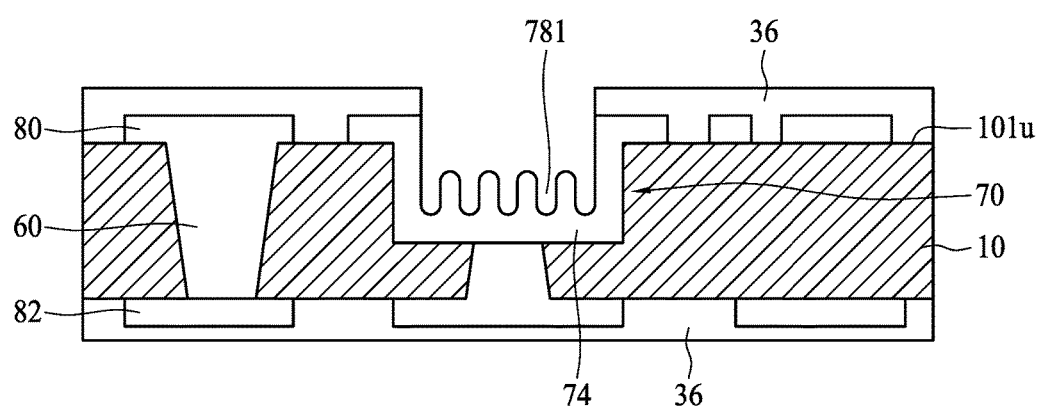
Figure 5R:
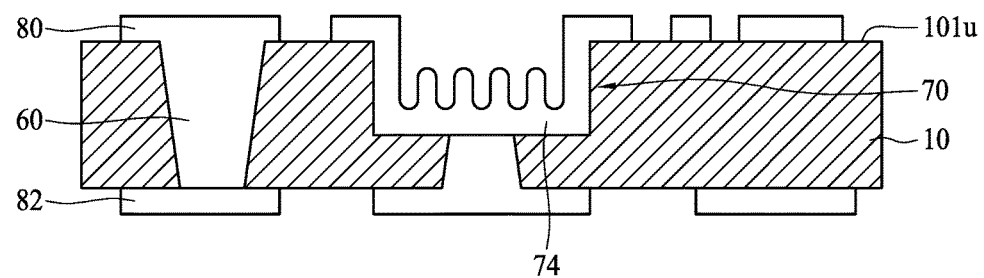
Figure 5S:
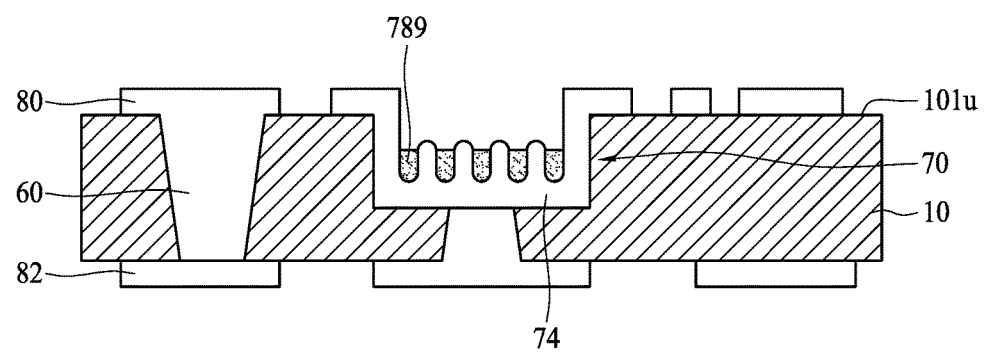
Figure 5T:
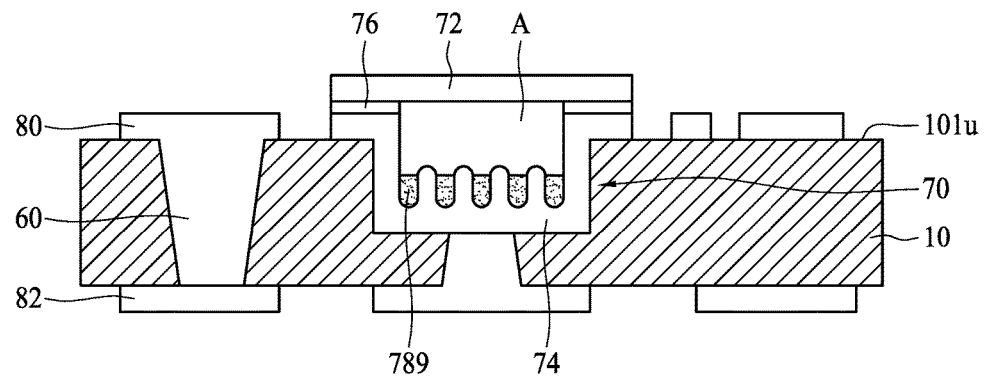
Figure 5U:
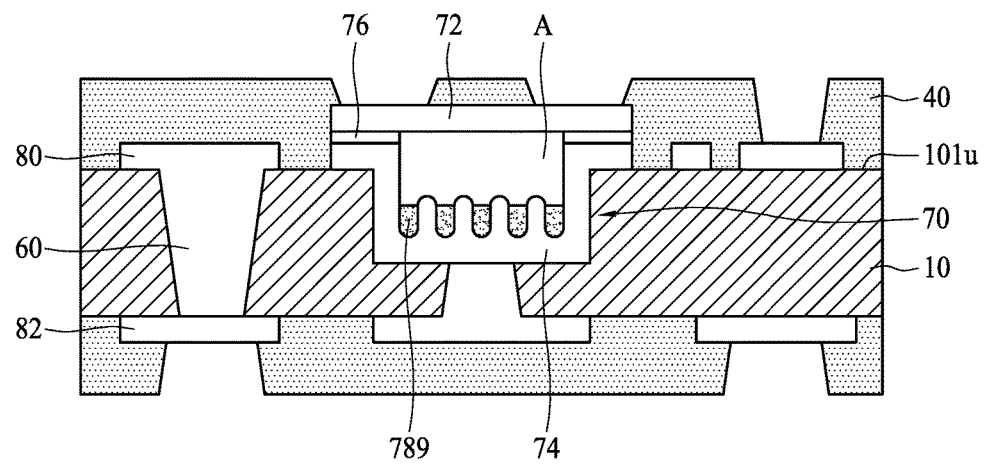
Figure 5V:
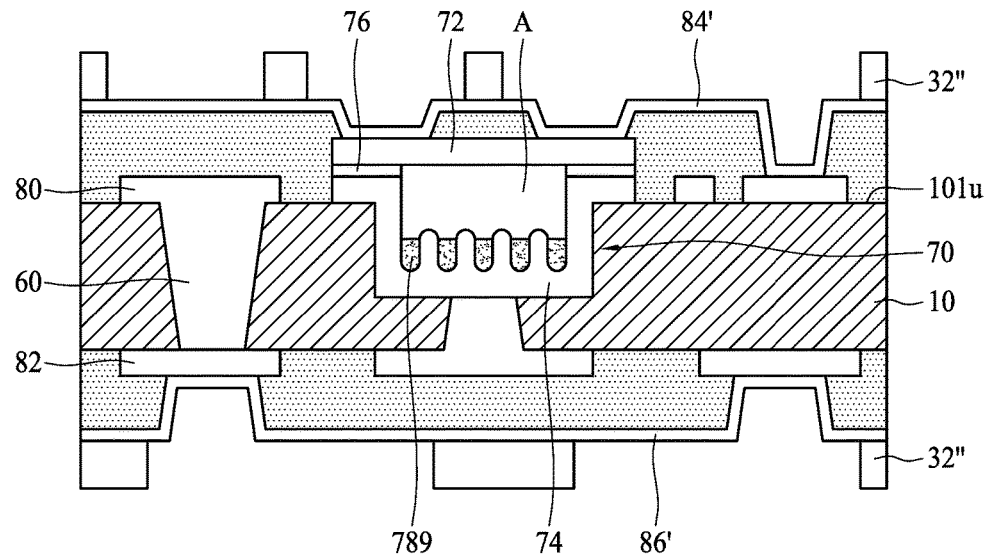
Figure 5W:
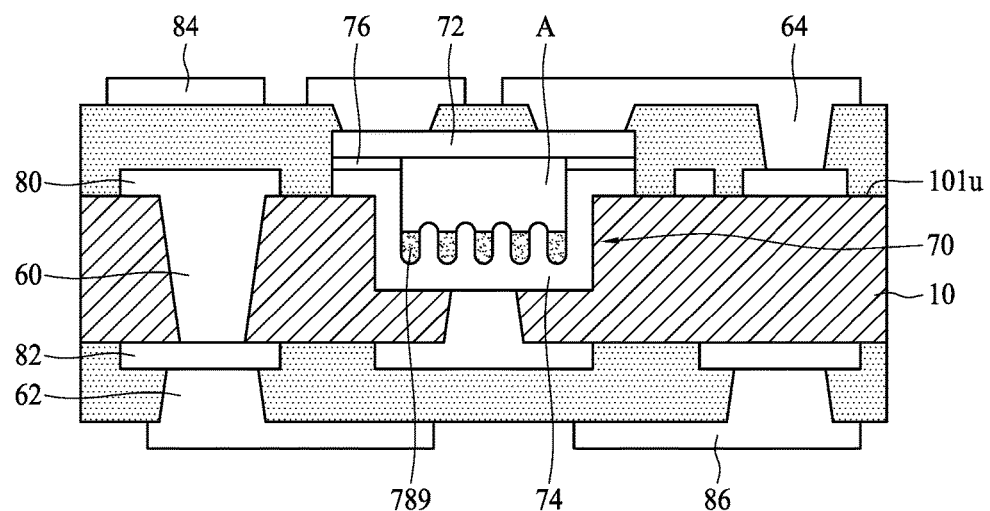
Figure 5X:
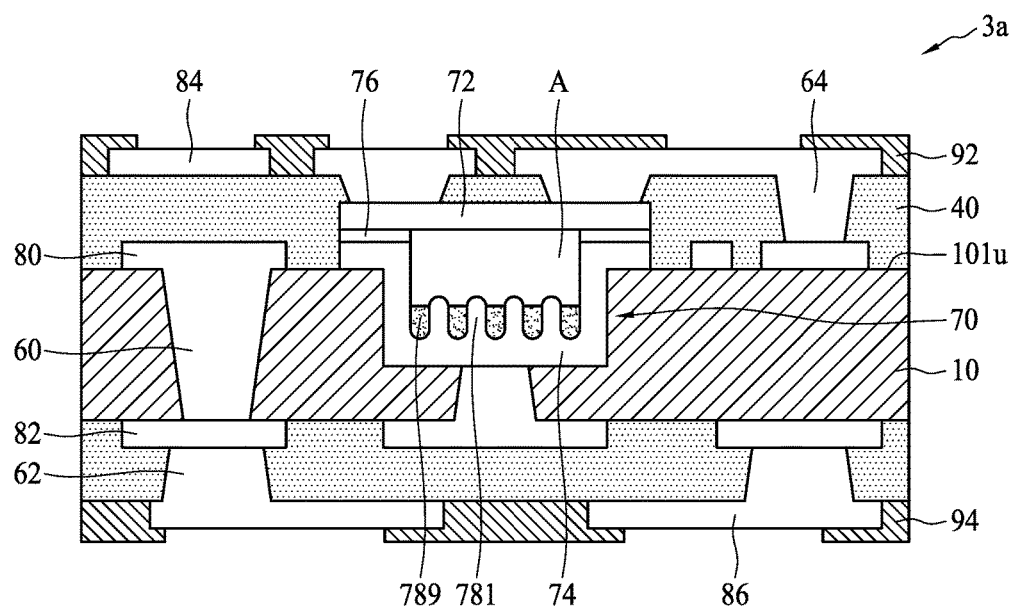

FIGS. 5A-5X illustrate some embodiments of a method of manufacturing a semiconductor substrate 3a. Referring to FIG. 5A, a carrier 12 is provided. A seed layer 35 is disposed or formed on the carrier 12. In some embodiments, the seed layer 35 may include, for example, Cu, or other metal, or a metal alloy, or other conductive material.

Referring to FIG. 5B, a patterned photo resist layer 32 is disposed or formed on the seed layer 35. In some embodiments, the patterned photo resist layer 32 may include, for example, a photosensitive material, a positive polyimide, a positive or negative photoresist or other suitable materials.

Referring to FIG. 5C, a seed layer 37 is disposed or formed to cover the patterned photo resist layer 32. In some embodiments, the seed layer 37 may include, for example, Cu, or other metal, or a metal alloy, or other conductive material. A top surface and a side wall of the patterned photo resist layer 32 are covered by the seed layer 37.

Referring to FIG. 5D, a dielectric layer 10 is disposed or formed on the patterned photo resist layer 32 and the carrier 12. In some embodiments, the dielectric layer 10 includes PP, PI, ABF, or other suitable insulating materials. The dielectric layer 10 has or defines an opening. A metal layer 38 is formed on the dielectric layer 10. In some embodiments, the metal layer 38 may include, for example, Cu, or other metal, or a metal alloy, or other conductive material.

Referring to FIG. 5E, a seed layer 38' is disposed or formed on the metal layer 38. A patterned photo resist layer 34 is disposed or formed on the seed layer 38'. In some embodiments, the patterned photo resist layer 34 may include, for example, a photosensitive material, a positive polyimide, a positive or negative photoresist or other suitable materials.

Referring to FIG. 5F, a patterned conductive layer 82 is formed on the dielectric layer 10. A via 81 and the patterned conductive layer 82 are formed by a plating operation. The patterned photo resist layer 34 and underlying portions of the seed layer 38' and the metal layer 38 are removed. In some embodiments, a material of the via 81 and the patterned conductive layer 82 may include, for example, Cu, or other metal, or a metal alloy, or other conductive material.

Referring to FIG. 5G, the carrier 12 is removed. Next, a seed layer 39 is formed on a surface 101u of the dielectric layer 10. In some embodiments, the seed layer 39 may include, for example, Cu, or other metal, or a metal alloy, or other conductive material.

Referring to FIG. 5H, a patterned photo resist layer 36 is disposed or formed on the seed layer 39. In some embodiments, the patterned photo resist layer 36 may include, for example, a photosensitive material, a positive polyimide, a positive or negative photoresist or other suitable materials. The patterned photo resist layer 32 and the seed layer 37 are removed. A portion of the seed layer 39 is removed. In some embodiments, the seed layer 37 may be retained without removing.

Referring to FIG. 5I, the patterned photo resist layer 36 is removed. An opening 111 is formed by etching.

Referring to FIG. 5J, a seed layer 50 is disposed or formed on the dielectric layer 10. The seed layer 50 covers a side wall and a bottom surface of the opening 111. The seed layer 50 covers the via 81. In some embodiments, the seed layer 50 may include, for example, Cu, or other metal, or a metal alloy, or other conductive material.

Referring to FIG. 5K, a patterned photo resist layer 32' is disposed or formed on the seed layer 50 and covers the patterned conductive layer 82. In some embodiments, the patterned photo resist layer 32' may include, for example, a photosensitive material, a positive polyimide, a positive or negative photoresist or other suitable materials.

Referring to FIG. 5L, a patterned conductive layer 80, a via 60 and a portion of a heat dissipation structure 70 to be etched are formed by plating. In some embodiments, the via 60 and the portion of the heat dissipation structure 70 to be etched may include, for example, Cu, or other metal, or a metal alloy, or other conductive material.

Referring to FIG. 5M, a patterned photo resist layer 34' is disposed or formed on the dielectric layer 10 and the patterned conductive layer 80 and covers the patterned conductive layer 82. In some embodiments, the patterned photo resist layer 34' may include, for example, a photosensitive material, a positive polyimide, a positive or negative photoresist or other suitable materials.

Referring to FIG. 5N, openings 741 are formed by etching. A width of the openings 741 ranges from about 50 μm to about 100 μm, which may promote capillary effects.

Referring to FIG. 5O, the patterned photo resist layer 34' is removed. A portion of the dielectric layer 10 is exposed.

Referring to FIG. 5P, a patterned photo resist layer 36 is disposed or formed on dielectric layer 10 and covers the patterned conductive layers 80 and 82. The openings 741 are exposed and not covered by the patterned photo resist layer 36. In some embodiments, the patterned photo resist layer 36 may include, for example, a photosensitive material, a positive polyimide, a positive or negative photoresist or other suitable materials.

Referring to FIG. 5Q, the openings 741 and the exposed portion of the heat dissipation structure 70 are etched. In some embodiments, two etching operations are performed. A plurality of trenches 781 are formed after a first etching operation. An air cavity within the heat dissipation structure 70 is formed after a second etching operation. A surface of the trenches 781 is formed by using a chemical solution to treat the surface, so that the surface of the trenches 781 includes a capillary structure, a porous surface, a non-planar surface, or a rough surface.

Referring to FIG. 5R, the patterned photo resist layer 36 is removed. After the removing operation, a lower portion 74 of the heat dissipation structure 70 is formed.

Referring to FIG. 5S, a working liquid 789 is filled into the lower portion 74 of the heat dissipation structure 70. In some embodiments, the liquid 789 includes one or more of water, alcohols, ketones (e.g., acetone) and ammonia. The surface within the lower portion 74 of the heat dissipation structure 70 includes a capillary structure, a porous surface, a non-planar surface, or a rough surface. In some embodiments, a plurality of objects selected from Cu mesh, Cu fiber, sintered metal powder, or combinations of two or more thereof may be filled into the lower portion 74 of the heat dissipation structure 70.

Referring to FIG. 5T, an upper portion 72 of the heat dissipation structure 70 is disposed on the lower portion 74 through an adhesive layer 76. In some embodiments, the adhesive layer 76 may include an adhesive material, an organic material or an inorganic material or other suitable materials. The space A is enclosed/sealed after disposing the upper portion 72. After sealing the space A, the heat dissipation structure 70 is obtained. A pressure within the heat dissipation structure 70 is no greater than, or lower than, about 1 atm.

Referring to FIG. 5U, an insulation layer 40 is disposed or formed on the dielectric layer 10 and covers the patterned conductive layers 80 and 82 and a portion of the heat dissipation structure 70. In some embodiments, the insulation layer 40 includes PP, PI, ABF, or other suitable insulating materials. The insulation layer 40 has or defines openings.

Referring to FIG. 5V, a seed layer 84' and a seed layer 86' are disposed or formed on the insulation layer 40. A patterned photo resist layer 32'' is disposed or formed on the seed layer 84' and the seed layer 86'. In some embodiments, the seed layer 84' and the seed layer 86' may include, for example, Cu, or other metal, or a metal alloy, or other conductive material.

Referring to FIG. 5W, patterned conductive layers 84 and 86 and vias 62 and 64 are formed by plating. In some embodiments, the patterned conductive layers 84 and 86 and the vias 62 and 64 may include, for example, Cu, or other metal, or a metal alloy, or other conductive material.

Referring to FIG. 5X, a protection layer 92 is disposed on the patterned conductive layer 84 and a protection layer 94 is disposed on the patterned conductive layer 86. Portions of the patterned conductive layers 84 and 86 are exposed. In some embodiments, the protection layers 92 and 94 may be solder mask layers. After the protection layers 92 and 94 are disposed, the semiconductor substrate 3a of FIG. 5X is obtained.

Figure 6A:
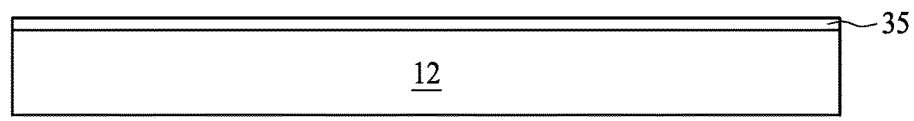
FIG. 6A, FIG. 6B, FIG. 6C, FIG. 6D, FIG. 6E, FIG. 6F, FIG. 6G, FIG. 6H, FIG. 6I, FIG. 6J, FIG. 6K and FIG. 6L illustrate a method of manufacturing a semiconductor substrate in accordance with some embodiments of the present disclosure.

FIGS. 6A-6L illustrate some embodiments of a method of manufacturing a semiconductor substrate 4. Referring to FIG. 6A, a carrier 12 is provided. A seed layer 35 is disposed or formed on the carrier 12. In some embodiments, the seed layer 35 may include, for example, Cu, or other metal, or a metal alloy, or other conductive material.

Figure 6B:
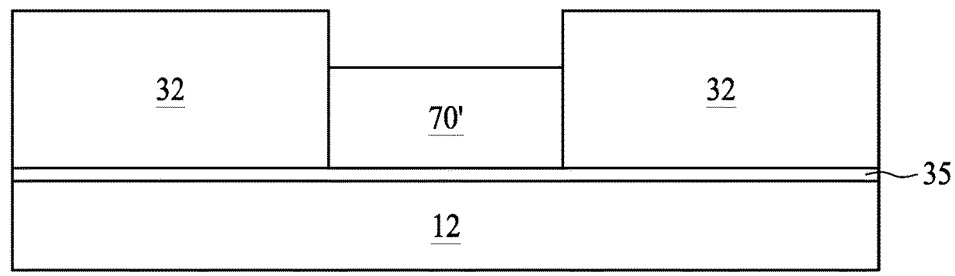

Referring to FIG. 6B, a patterned photo resist layer 32 is disposed or formed on the carrier 12. A bump/block 70' is disposed or formed on the carrier 12. In some embodiments, the patterned photo resist layer 32 may include, for example, a photosensitive material, a positive polyimide, a positive or negative photoresist or other suitable materials. In some embodiments, the bump 70' may include, for example, Cu, or other metal, or a metal alloy, or other conductive material.

Figure 6C:
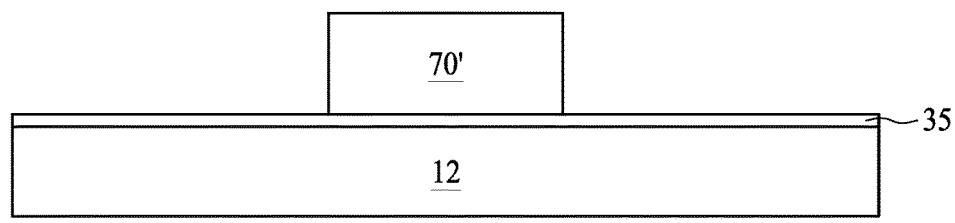

Referring to FIG. 6C, the patterned photo resist layer 32 is removed. A side wall of the bump 70' is exposed.

Figure 6D:
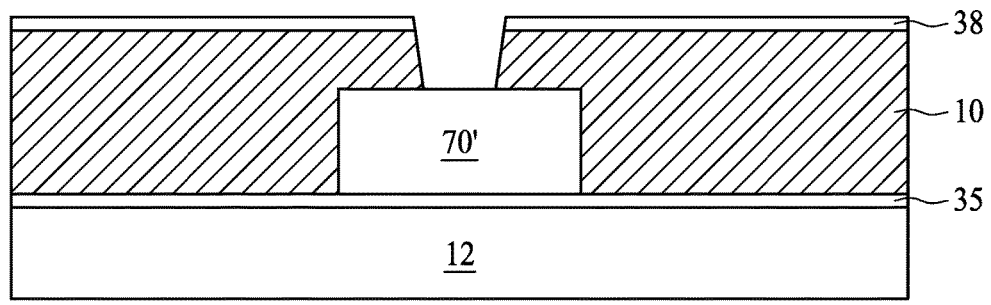

Referring to FIG. 6D, a dielectric layer 10 is disposed or formed on the bump 70' and the carrier 12. In some embodiments, the dielectric layer 10 includes PP, PI, ABF, or other suitable insulating materials. The dielectric layer 10 has or defines an opening. A metal layer 38 is disposed or formed on the dielectric layer 10. In some embodiments, the metal layer 38 may include, for example, Cu, or other metal, or a metal alloy, or other conductive materials.

Figure 6E:
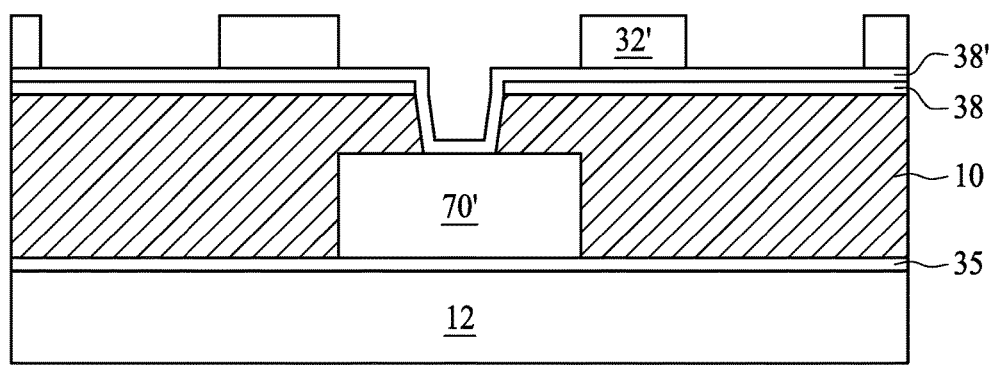

Referring to FIG. 6E, a seed layer 38' is disposed or formed on the metal layer 38. A patterned photo resist layer 32' is disposed or formed on the seed layer 38'. In some embodiments, the patterned photo resist layer 32' may include, for example, a photosensitive material, a positive polyimide, a positive or negative photoresist or other suitable materials.

Figure 6F:
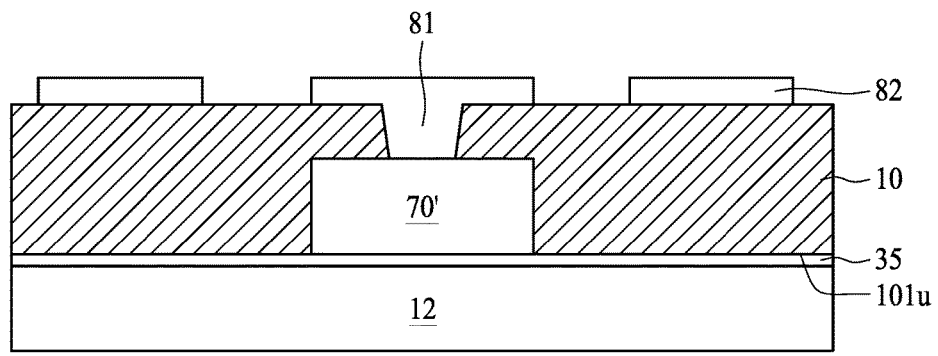

Referring to FIG. 6F, a patterned conductive layer 82 is formed on the dielectric layer 10. A via 81 and the patterned conductive layer 82 are formed by a plating operation. The patterned photo resist layer 32' is removed. In some embodiments, a material of the via 81 and the patterned conductive layer 82 may include, for example, Cu, or other metal, or a metal alloy, or other conductive material.

Figure 6G:
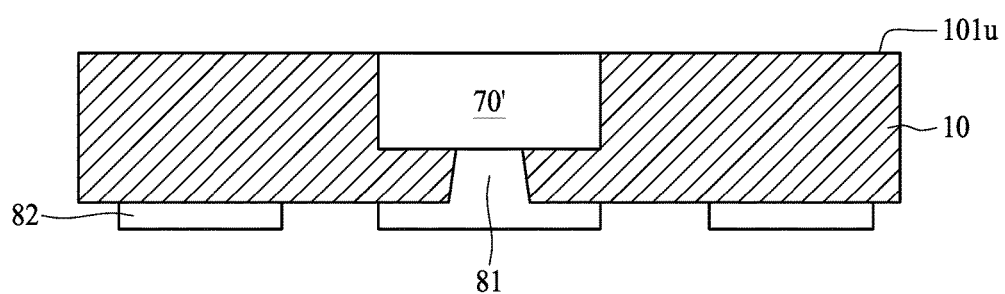

Referring to FIG. 6G, the carrier 12 and the seed layer 35 are removed. The bump 70' is exposed after the removing operation.

Figure 6H:
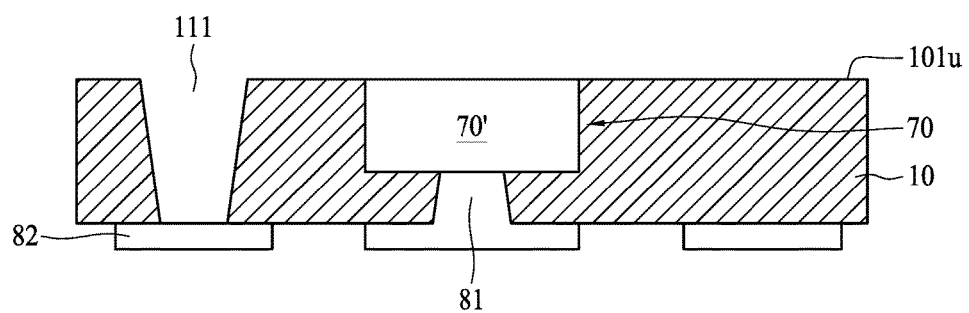

Referring to FIG. 6H, an opening 111 is formed by etching. The opening 111 is recessed from a surface 101u.

Figure 6I:
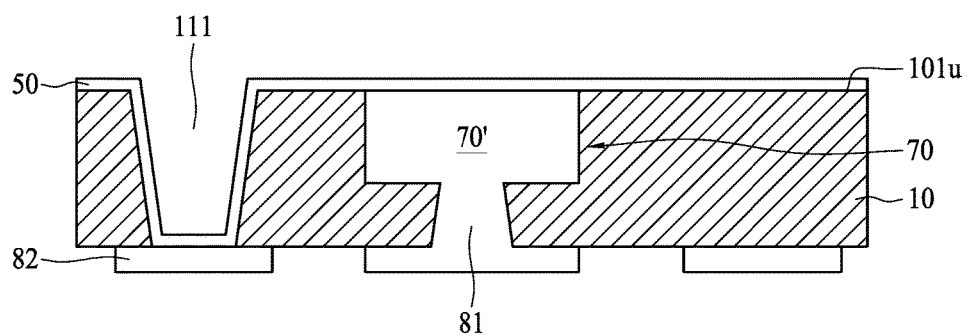

Referring to FIG. 6I, a seed layer 50 is disposed or formed on the dielectric layer 10. The seed layer 50 covers a side wall and a bottom surface of the opening 111. The seed layer 50 covers the bump 70'. In some embodiments, the seed layer 50 may include, for example, Cu, or other metal, or a metal alloy, or other conductive material.

Figure 6J:
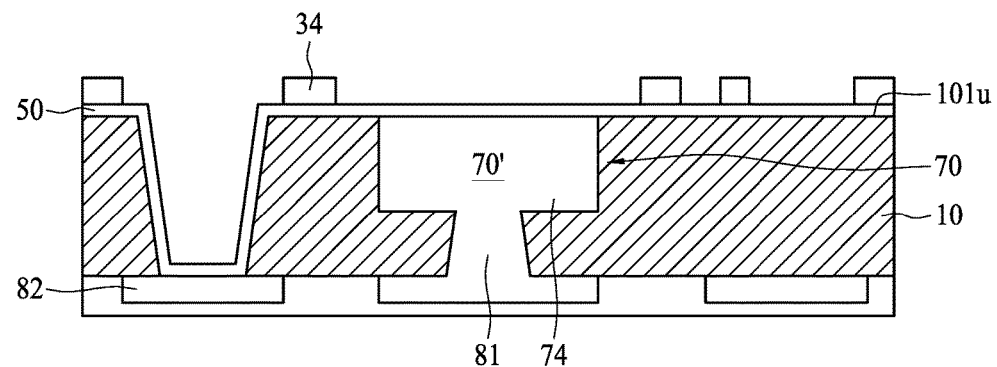

Referring to FIG. 6J, a patterned photo resist layer 34 is disposed or formed on seed layer 50 and covers the patterned conductive layer 82. In some embodiments, the patterned photo resist layer 34 may include, for example, a photosensitive material, a positive polyimide, a positive or negative photoresist or other suitable materials.

Figure 6K:
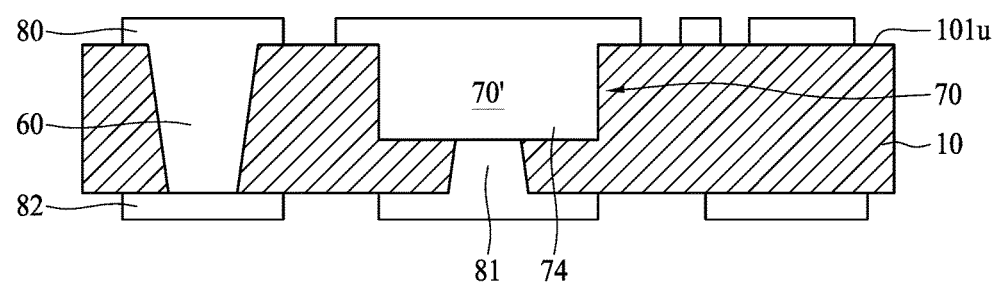

Referring to FIG. 6K, a patterned conductive layer 80 and a via 60 are formed by plating. In some embodiments, the via 60 may include, for example, Cu, or other metal, or a metal alloy, or other conductive material.

Figure 6L:
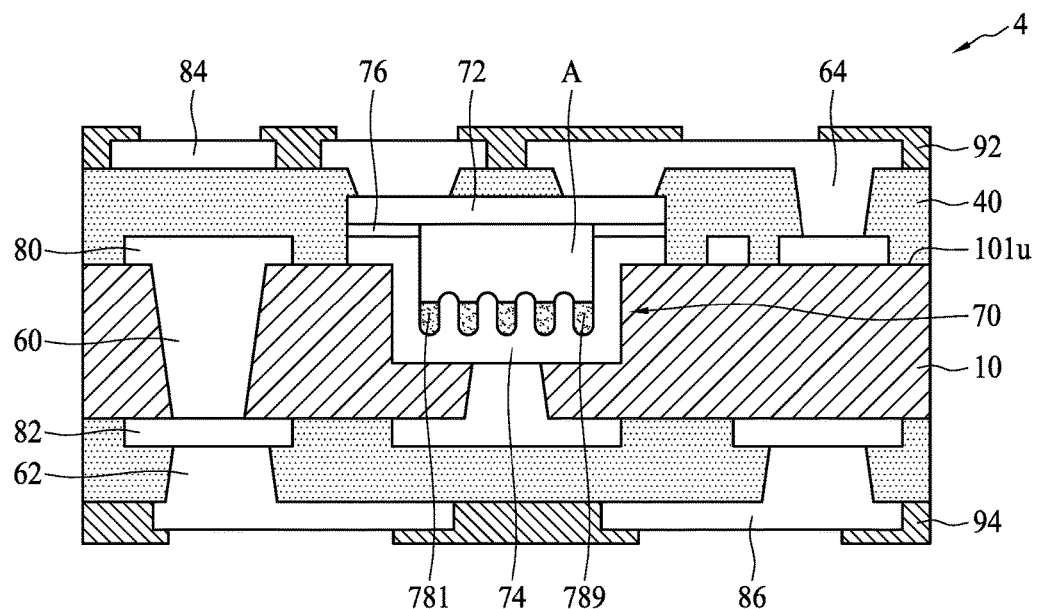

Referring to FIG. 6L, forming operations of trenches 781 and a heat dissipation structure 70 are similar to the trenches 781 of the semiconductor substrate 3a. After sealing the heat dissipation structure 70, protection layers 92 and 94 and an insulation layer 40 are disposed or formed. Next, the semiconductor substrate 4 is obtained.

Figure 7A:
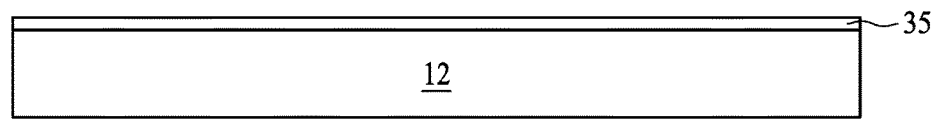
FIG. 7A, FIG. 7B, FIG. 7C, FIG. 7D, FIG. 7E, FIG. 7F, FIG. 7G, FIG. 7H, FIG. 7I, FIG. 7J, FIG. 7K, FIG. 7L and FIG. 7M illustrate a method of manufacturing a semiconductor substrate in accordance with some embodiments of the present disclosure.

FIGS. 7A-7M illustrate some embodiments of a method of manufacturing a semiconductor substrate 5. Referring to FIG. 7A, a carrier 12 is provided. A seed layer 35 is disposed or formed on the carrier 12. In some embodiments, the seed layer 35 may include, for example, Cu, or other metal, or a metal alloy, or other conductive material.

Figure 7B:
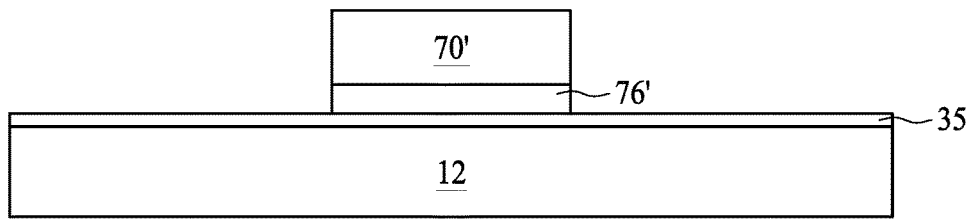

Referring to FIG. 7B, a bump 70' is disposed or formed on the carrier 12. The bump 70' is attached to the carrier 12 through an adhesive layer 76'. In some embodiments, the bump 70' may include, for example, Cu, or other metal, or a metal alloy, or other conductive material. In some embodiments, the adhesive layer 76' may include an adhesive material, an organic material or an inorganic material or other suitable materials.

Figure 7C:
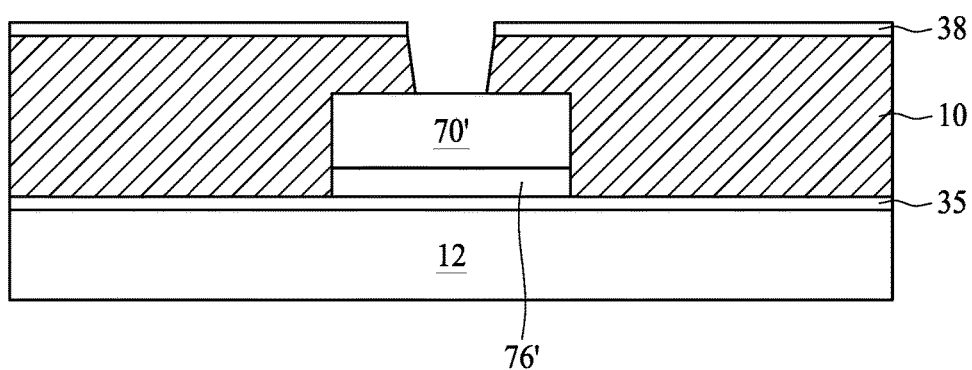

Referring to FIG. 7C, a dielectric layer 10 is disposed or formed on the carrier 12. In some embodiments, the dielectric layer 10 includes PP, PI, ABF, or other suitable insulating materials. The dielectric layer 10 has or defines an opening. A metal layer 38 is disposed or formed on the dielectric layer 10. In some embodiments, the metal layer 38 may include, for example, Cu, or other metal, or a metal alloy, or other conductive material.

Figure 7D:
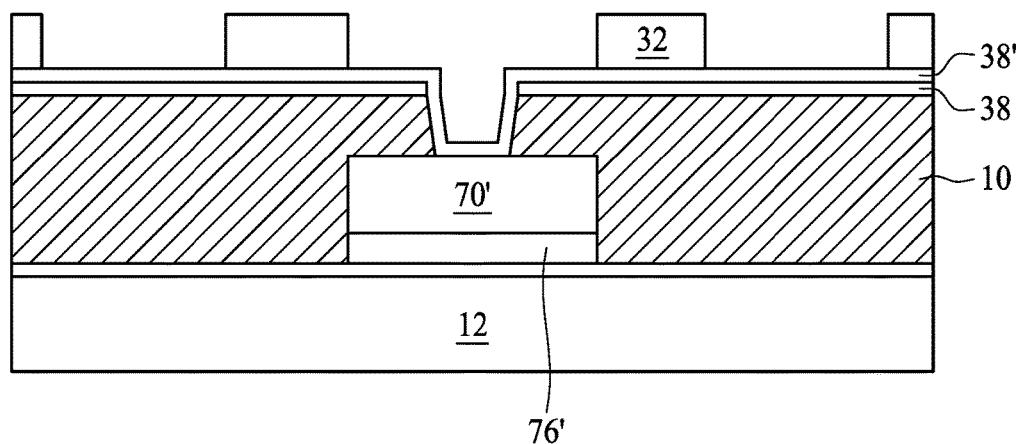

Referring to FIG. 7D, a seed layer 38' is disposed or formed on the metal layer 38. A patterned photo resist layer 32 is disposed or formed on seed layer 38'. In some embodiments, the patterned photo resist layer 32 may include, for example, a photosensitive material, a positive polyimide, a positive or negative photoresist or other suitable materials.

Figure 7E:
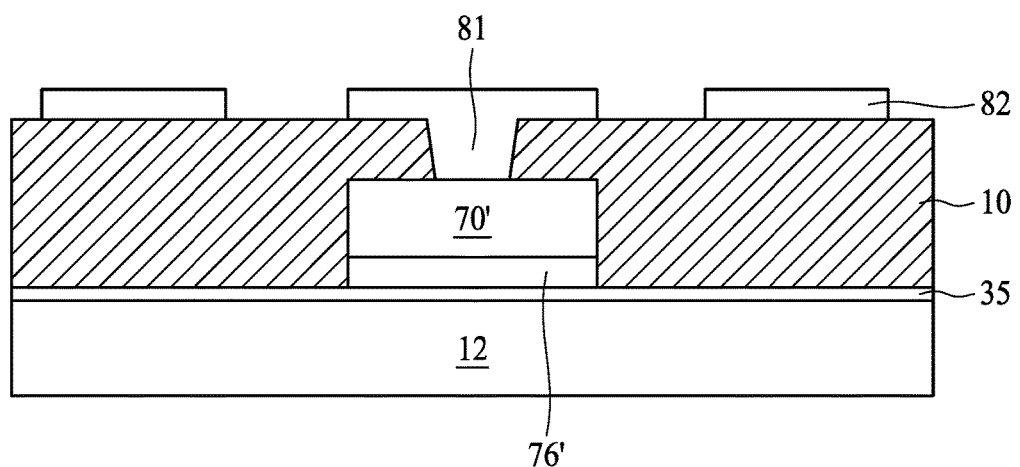

Referring to FIG. 7E, a patterned conductive layer 82 is formed on the dielectric layer 10. A via 81 and the patterned conductive layer 82 are formed by a plating operation. The patterned photo resist layer 32 and underlying portions of the seed layer 38' and the metal layer 38 are removed. In some embodiments, a material of via 81 and the patterned conductive layer 82 may include, for example, Cu, or other metal, or a metal alloy, or other conductive material.

Figure 7F:
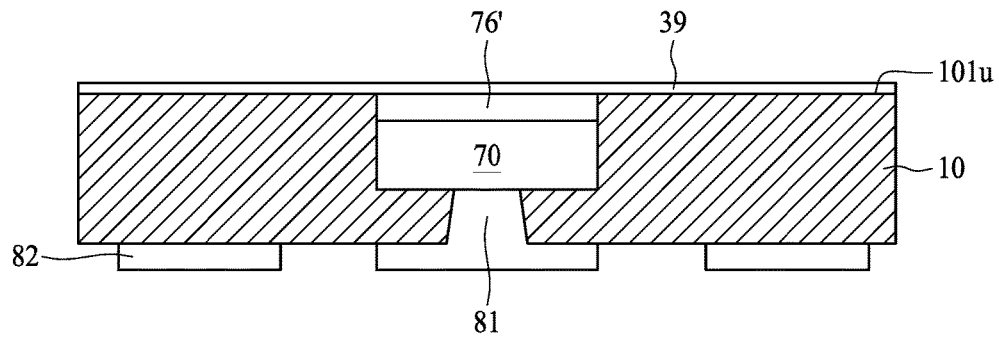

Referring to FIG. 7F, the carrier 12 and the seed layer 35 are removed. Next, a seed layer 39 is disposed or formed on a surface 101u of the dielectric layer 10. In some embodiments, the seed layer 39 may include, for example, Cu, or other metal, or a metal alloy, or other conductive material.

Figure 7G:
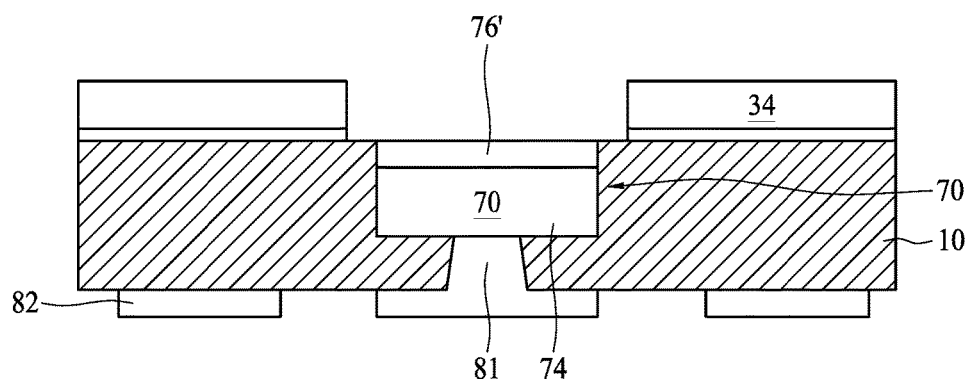

Referring to FIG. 7G, a portion of the seed layer 39 is removed. A patterned photo resist layer 34 is disposed or formed on the seed layer 39. In some embodiments, the patterned photo resist layer 34 may include, for example, a photosensitive material, a positive polyimide, a positive or negative photoresist or other suitable materials.

Figure 7H:
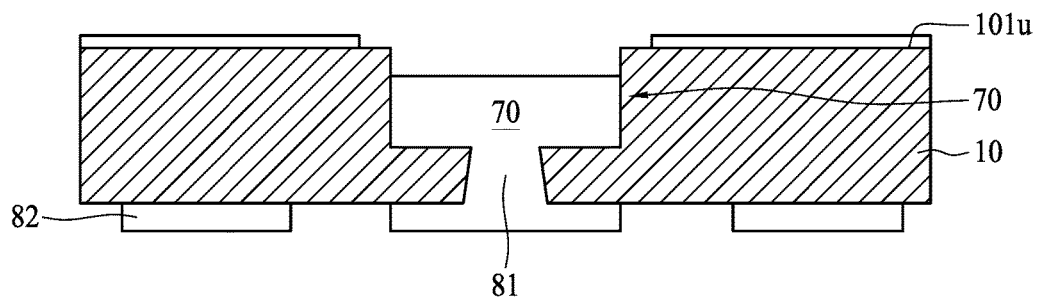

Referring to FIG. 7H, the patterned photo resist layer 34 is removed. The adhesive layer 76' is removed.

Figure 7I:
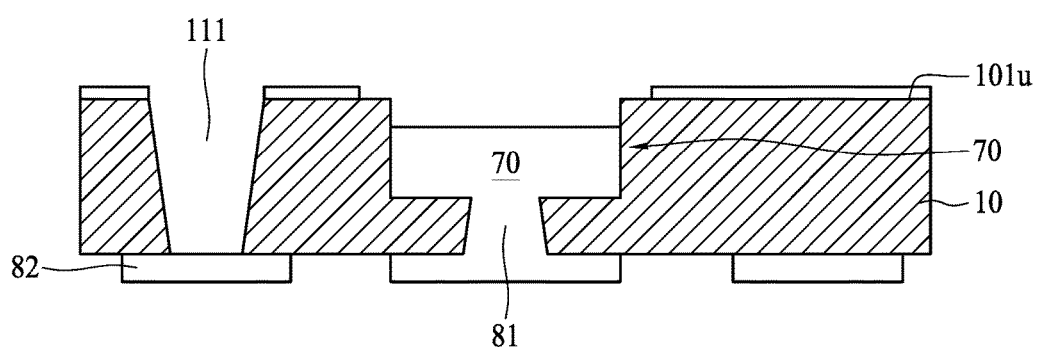

Referring to FIG. 7I, an opening 111 is formed by etching.

Figure 7J:
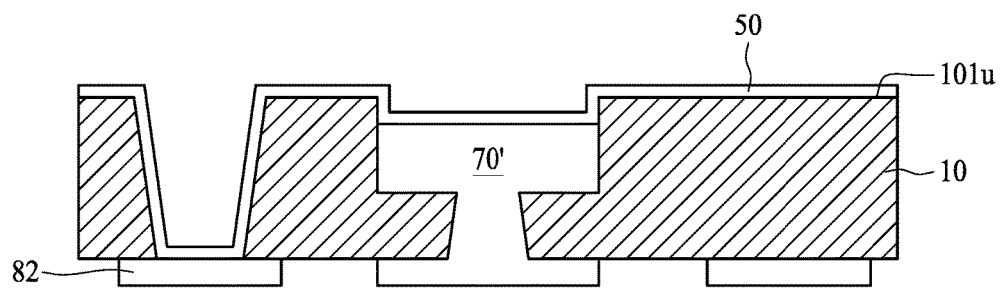

Referring to FIG. 7J, a seed layer 50 is disposed or formed on the dielectric layer 10. The seed layer 50 covers a side wall and a bottom surface of the opening 111. The seed layer 50 covers a top surface of the bump 70'. In some embodiments, the seed layer 50 may include, for example, Cu, or other metal, or a metal alloy, or other conductive material.

Figure 7K:
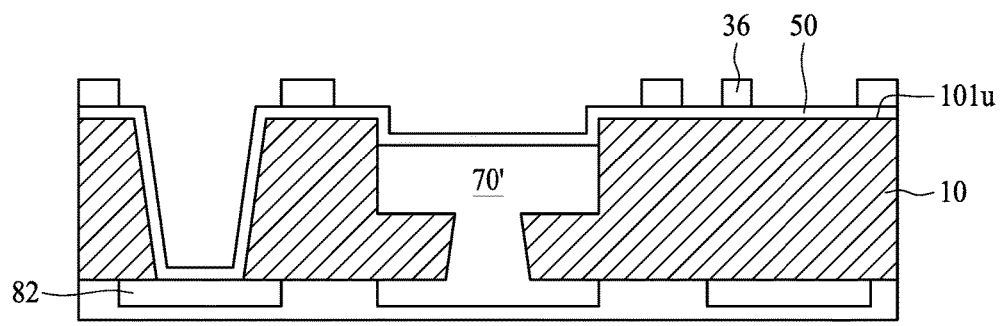

Referring to FIG. 7K, a patterned photo resist layer 36 is disposed or formed on the seed layer 50 and covers the patterned conductive layer 82. In some embodiments, the patterned photo resist layer 36 may include, for example, a photosensitive material, a positive polyimide, a positive or negative photoresist or other suitable materials.

Figure 7L:
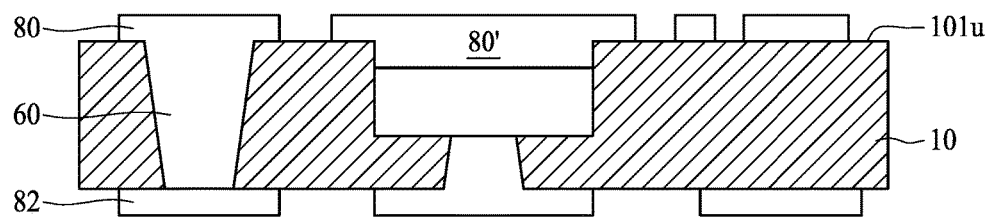

Referring to FIG. 7L, patterned conductive layers 80 and 80' are formed by plating. In some embodiments, the patterned conductive layer 80 and 80' may include, for example, Cu, or other metal, or a metal alloy, or other conductive material.

Figure 7M:
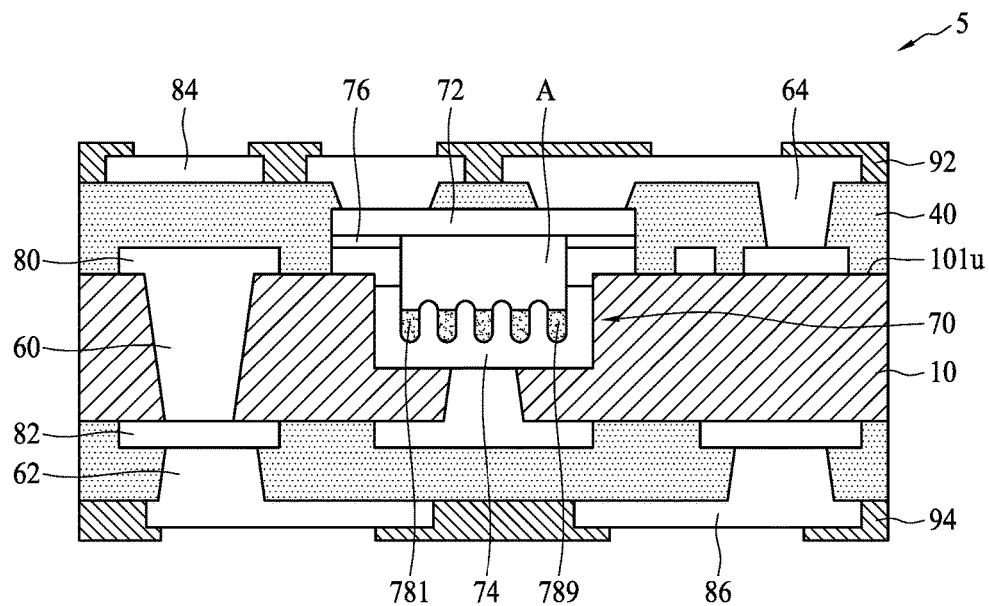

Referring to FIG. 7M, forming operations of the trenches 781 and a heat dissipation structure 70 are similar to the trenches 781 of the semiconductor substrate 3a. After sealing the heat dissipation structure 70, protection layers 92 and 94 and an insulation layer 40 are disposed or formed. Next, the semiconductor substrate 5 is obtained. A surface within the space A of the heat dissipation structure 70 is a non-planar surface including the plurality of trenches 781. The trenches 781 extend from a heat absorbing end 90 to a cooling end 92 (not shown).

Figure 7N:
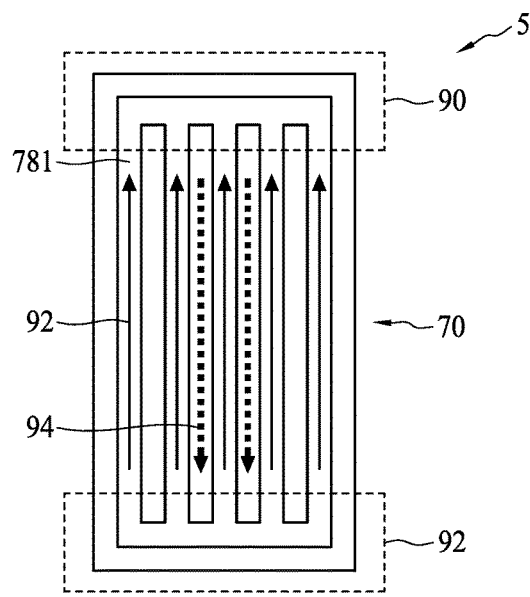
FIG. 7N is a schematic diagram of a top view of the semiconductor substrate as shown in FIG. 7M.

FIG. 7N is a schematic diagram of a top view of the semiconductor substrate 5 as shown in FIG. 7M in accordance with some embodiments of the present disclosure. The heat dissipation structure 70 includes a heat absorbing end 90 and a cooling end 92 opposite to the heat absorbing end 90. A working liquid 789 is within the heat dissipation structure 70. The liquid 789 at the heat absorbing end 90 may be heated to a vapor state. The arrow 94 represents the vapor flow direction within the heat dissipation structure 70. The vapor within the heat dissipation structure 70 will flow to the cooling end 92 through the trenches 781 after absorbing the heat. The heat of the vapor may be transmitted to the external environment at the cooling end 92 and the vapor will be condensed into a liquid state. Next, the liquid 789 will flow back to the heat absorbing end 90 through the capillary structure of the trenches 781 within the heat dissipation structure 70. A heat transmitting cycle is completed after the liquid 789 flows back to the heat absorbing end 90.

Figure 8:
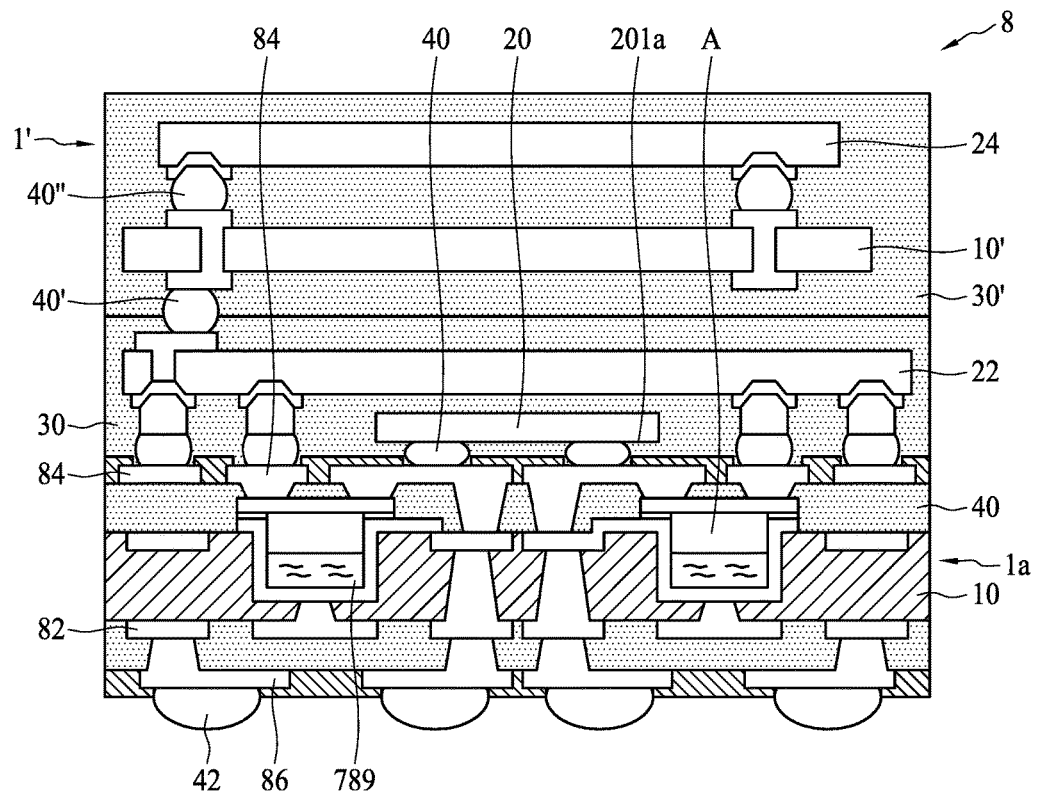
FIG. 8 is a cross-sectional view of a semiconductor package structure in accordance with some embodiments of the present disclosure.

FIG. 8 is a cross-sectional view of a semiconductor package structure 8 in accordance with some embodiments of the present disclosure. A semiconductor substrate 1a is similar to the semiconductor substrate 1 of FIG. 1, and certain details of same-numbered components are not described again with respect to FIG. 8. A bottom surface within a space A of an enclosed/hermetic heat dissipation structure 70 is a non-planar surface of a capillary structure. Chips 20 and 22 are disposed on the substrate 1a. The chip 20 is electrically and thermally connected to the patterned conductive layer 84. An active layer 201a of the chip 20 faces the substrate 1a. The chip 20 includes a conductive connect 40. In some embodiments, the conductive connect 40 may be solder bumps. The chip 20 is electrically and thermally connected to the patterned conductive layer 84 through the conductive connect 40. A conductive connect 42 is disposed on a pad 86 which is connected to the patterned conductive layer 82. In some embodiments, the semiconductor package structure 8 may include another substrate 1' similar to the substrate 1. The substrate 1' includes a chip 24, a dielectric layer 10', an encapsulating material 30' and conductive connects 40' and 40". The substrate 1' is disposed on the substrate 1a and is electrically connected to a conductive connect/patterned conductive layer 84 of the substrate 1a through conductive connects 40' and 40". An encapsulating material 30 is disposed between the substrate 1a, the chip 20 and the substrate P. The encapsulating material 30 encapsulates the chips 20 and 22.

Figure 9:
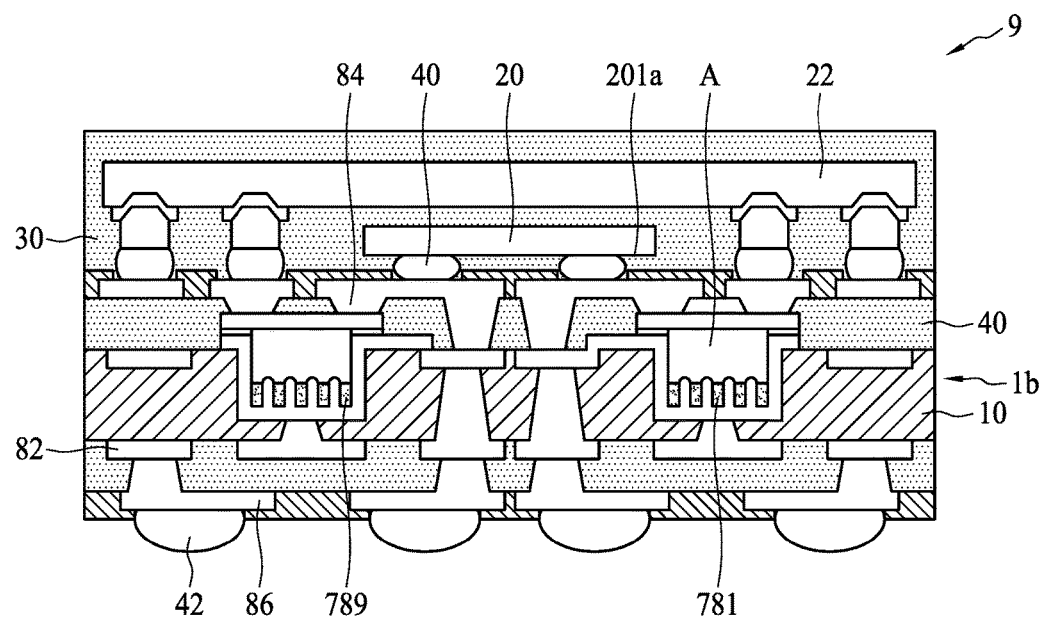
FIG. 9 is a cross-sectional view of a semiconductor package structure in accordance with some embodiments of the present disclosure.

FIG. 9 is a cross-sectional view of a semiconductor package structure 9 in accordance with some embodiments of the present disclosure. The semiconductor substrate 1b is similar to the semiconductor substrate 1 of FIG. 1, and certain details of same-numbered components are not described again with respect to FIG. 9. A bottom surface within a space A of an enclosed/hermetic heat dissipation structure 70 is a non-planar surface of a capillary structure. Chips 20 and 22 are disposed on the substrate 1b. An encapsulating material 30 encapsulates the chips 20 and 22. The chip 20 is electrically and thermally connected to a patterned conductive layer 84. An active layer 201a of the chip 20 faces the substrate 1a. The chip 20 includes a conductive connect 40. The encapsulating material 30 is disposed between the substrate 1a and the chip 20. The bottom surface within the space A of the enclosed/hermetic heat dissipation structure 70 is a non-planar surface including a plurality of trenches 781. The trenches 781 may increase capillary effects for heat sinking.

Figure 10:
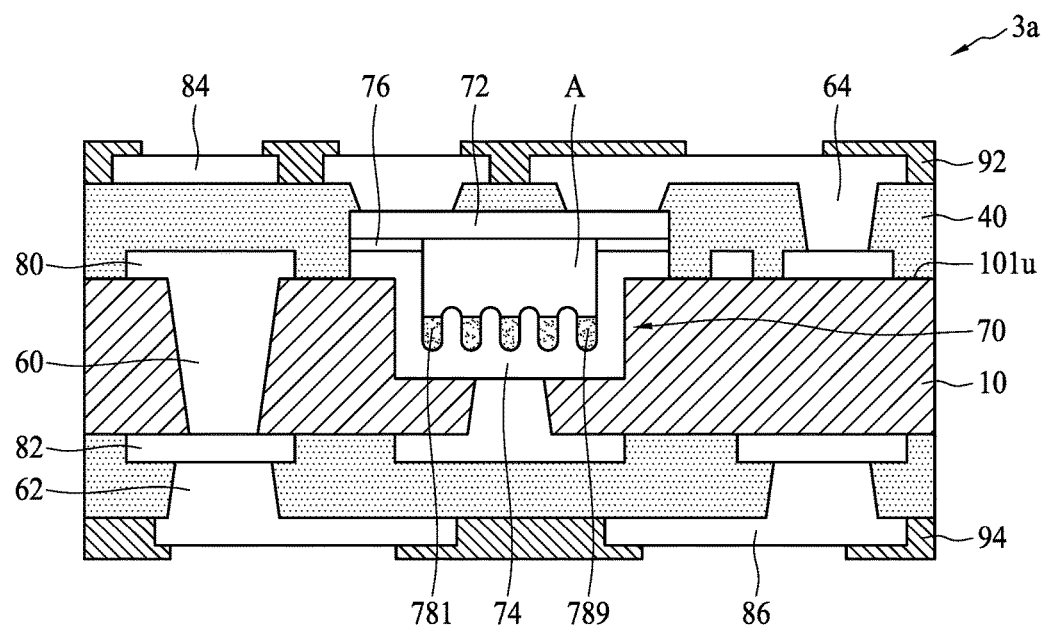
FIG. 10 is a cross-sectional view of a semiconductor substrate in accordance with some embodiments of the present disclosure.

FIG. 10 is a cross-sectional view of a semiconductor substrate 3a in accordance with some embodiments of the present disclosure. The semiconductor substrate 3a is similar to the semiconductor substrate 1 of FIG. 1, and certain details of same-numbered components are not described again with respect to FIG. 10. The semiconductor substrate 3a includes a dielectric layer 10, an enclosed/hermetic heat dissipation structure 70, patterned conductive layers 80, 82, 84 and 86, conductive vias 60, 62 and 64, an insulation layer 40 and protection layers 92 and 94. The enclosed/hermetic heat dissipation structure 70 has a plurality of trenches 781 extending from a heat absorbing end 90 to a cooling end 92. A working liquid 789 may flow in the trenches 781.

Figure 11:
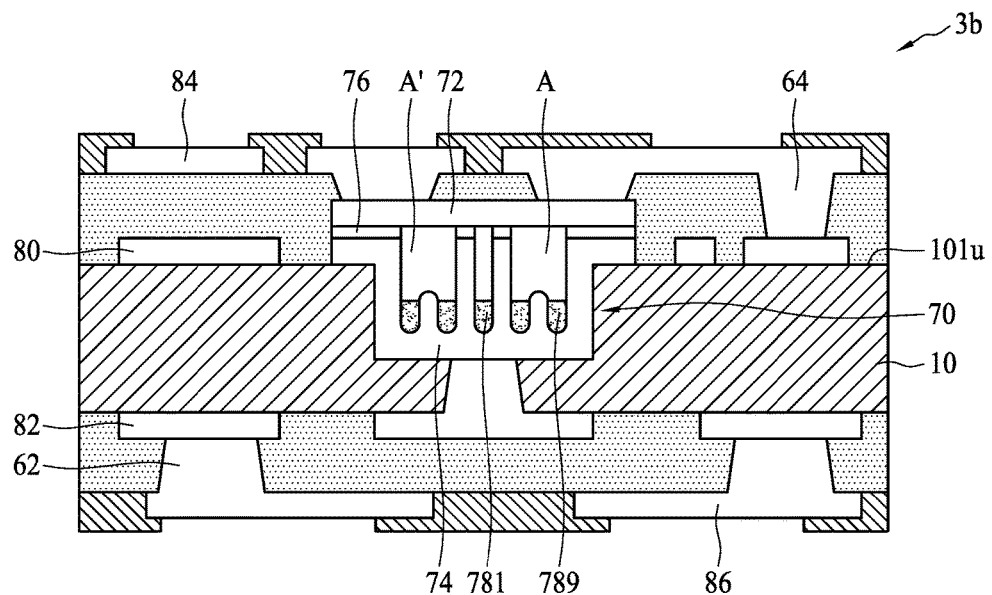
FIG. 11 is a cross-sectional view of a semiconductor substrate in accordance with some embodiments of the present disclosure.

FIG. 11 is a cross-sectional view of a semiconductor substrate 3b in accordance with an embodiment of the present disclosure. The semiconductor substrate 3b is similar to the semiconductor substrate 1 of FIG. 1, and same-numbered components are not described again with respect to FIG. 11. The enclosed/hermetic heat dissipation structure 70 may define two separate spaces A and A'. The work liquid in the spaces A and A' may flow in the trenches 781. The spaces A and A' are separated from each other.

Figure 12:
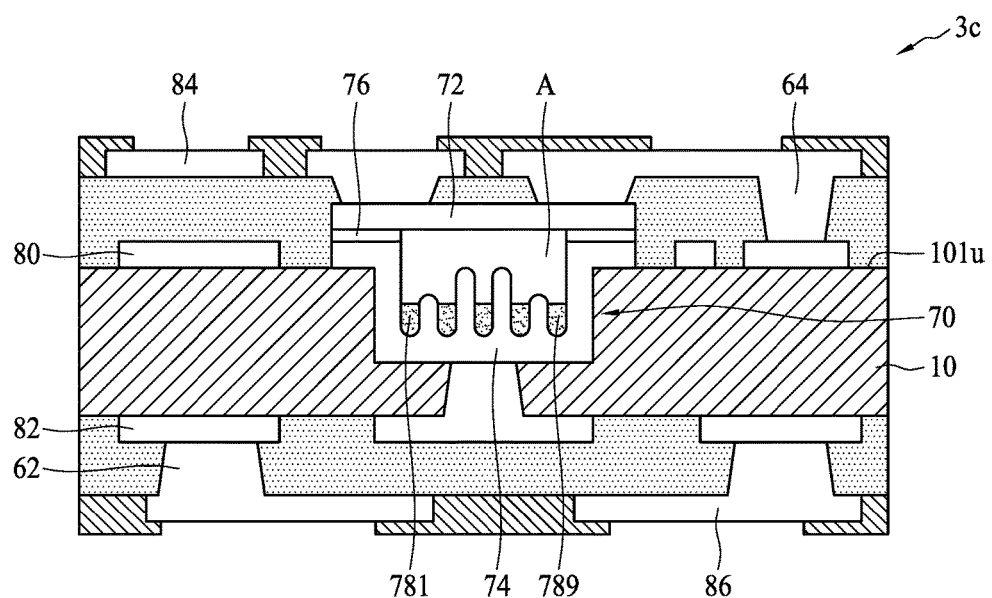
FIG. 12 is a cross-sectional view of a semiconductor substrate in accordance with some embodiments of the present disclosure.

FIG. 12 is a cross-sectional view of a semiconductor substrate 3c in accordance with some embodiments of the present disclosure. The semiconductor substrate 3c is similar to the semiconductor substrate 1 of FIG. 1, and certain details of same-numbered components are not described again with respect to FIG. 12. Depths of the trenches 781 may be different. Amounts of a working liquid 789 in the trenches 781 may be different from each other.

Figure 13:
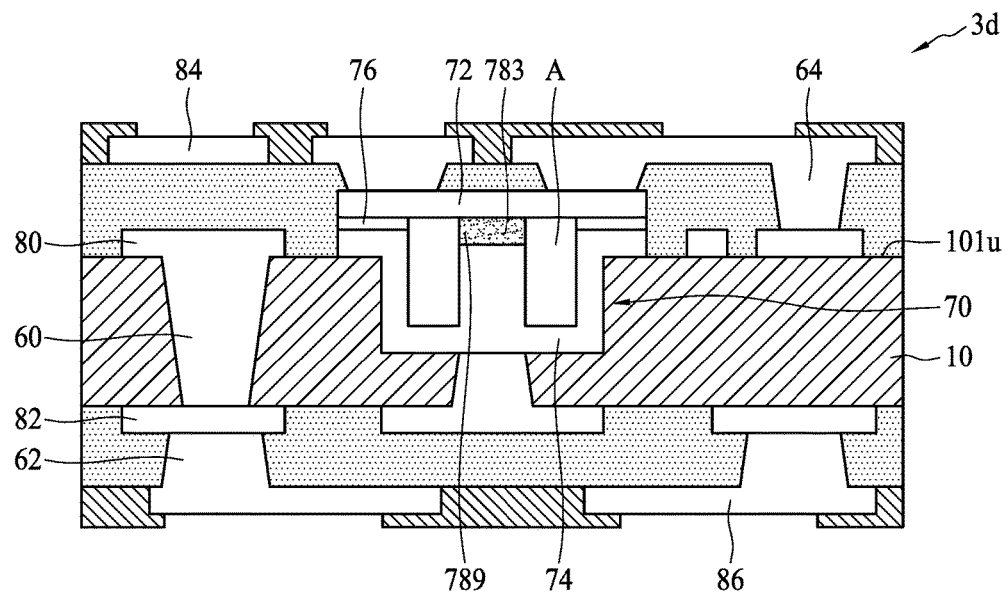
FIG. 13 is a cross-sectional view of a semiconductor substrate in accordance with some embodiments of the present disclosure.

FIG. 13 is a cross-sectional view of a semiconductor substrate 3d in accordance with some embodiments of the present disclosure. The semiconductor substrate 3d is similar to the semiconductor substrate 1 of FIG. 1, and certain details of same-numbered components are not described again with respect to FIG. 13. A heat dissipation structure 70 defines a gap 783 between a lower portion 74 and an upper portion 72. A height of the gap 783 may range from about 50 μm to about 100 μm, which may promote capillary effects. A working liquid 789 may flow between the gap 783.

Figure 14:
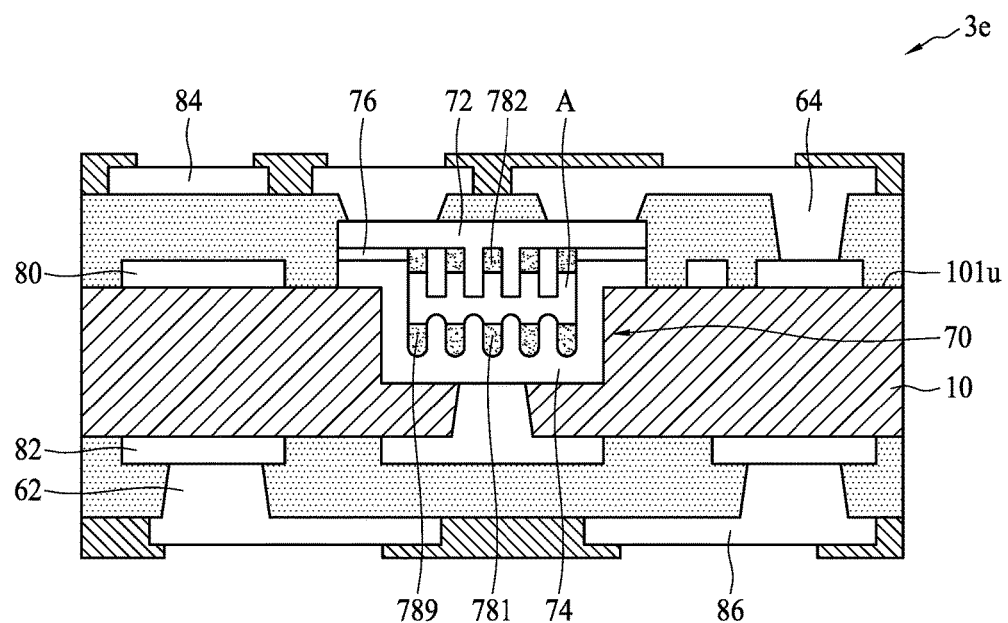
FIG. 14 is a cross-sectional view of a semiconductor substrate in accordance with some embodiments of the present disclosure.

FIG. 14 is a cross-sectional view of a semiconductor substrate 3e in accordance with some embodiments of the present disclosure. The semiconductor substrate 3e is similar to the semiconductor substrate 1 of FIG. 1, and certain details of same-numbered components are not described again with respect to FIG. 14. A surface of an upper portion 72 within the space A of an enclosed/hermetic heat dissipation structure 70 includes a plurality of trenches 782 extending between a heat absorbing end 90 and the cooling end 92. The trenches 782 and trenches 781 may increase capillary effects for heat sinking. A bottom surface within the space A of the enclosed/hermetic heat dissipation structure 70 is a non-planar surface. The non-planar surface includes the plurality of trenches 781. A surface of the upper portion 72 within the space A of the heat dissipation structure 70 includes the plurality of trenches 782 extended between the heat absorbing end 90 and the cooling end 92. A working liquid 789 in the trenches 781 and 782 may increase the effects for heat sinking through capillary effects.

Figure 15:
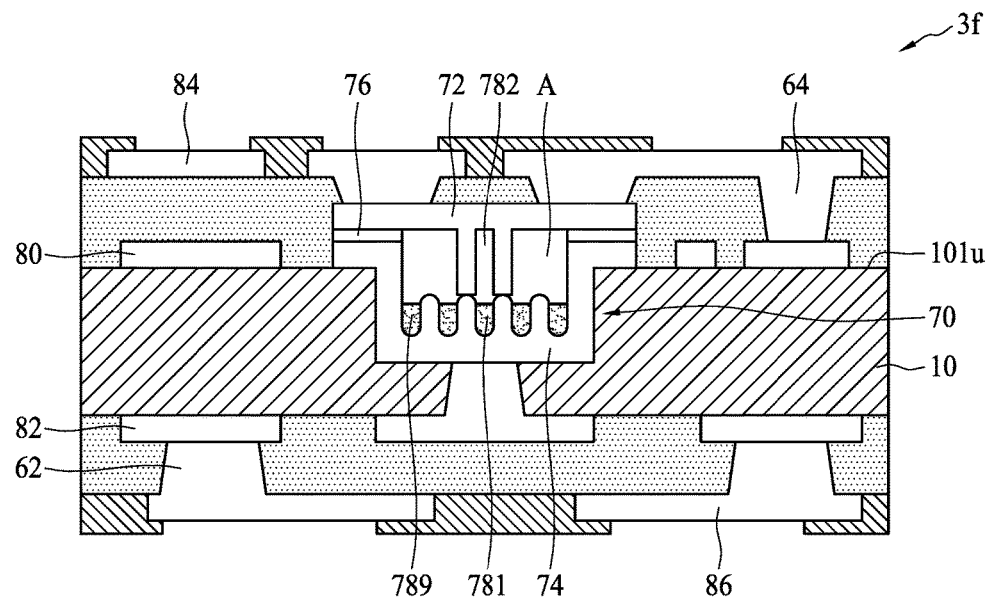
FIG. 15 is a cross-sectional view of a semiconductor substrate in accordance with some embodiments of the present disclosure.

FIG. 15 is a cross-sectional view of a semiconductor substrate 3f in accordance with some embodiments of the present disclosure. The semiconductor substrate 3f is similar to the semiconductor substrate 1 of FIG. 1, and certain details of same-numbered components are not described again with respect to FIG. 15. An upper portion 72 includes protrusions which contact a lower portion 74. The protrusions of the upper portion 72 may include a capillary structure, a porous surface, a non-planar surface, or a rough surface.

Figure 16:
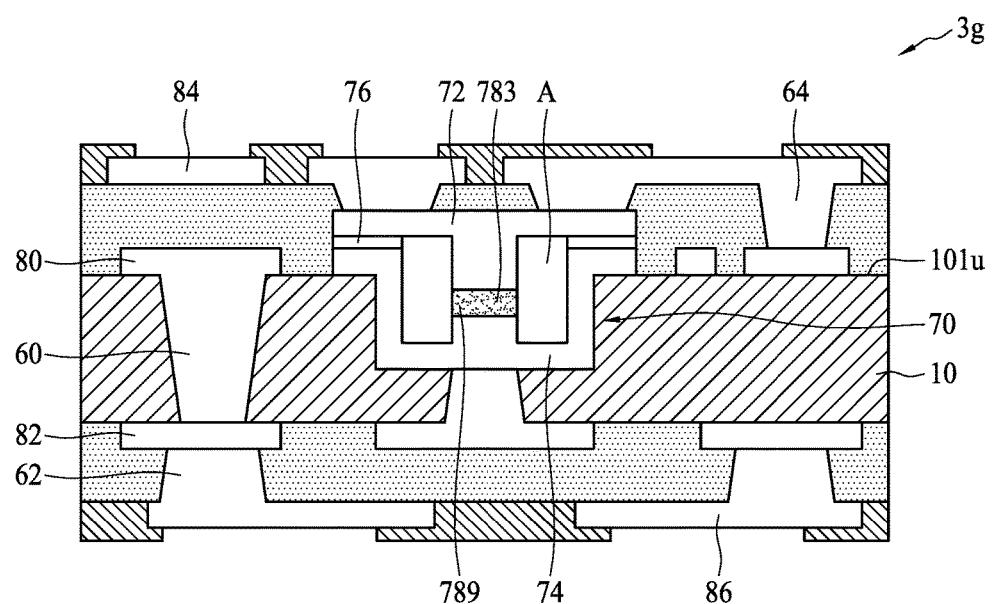
FIG. 16 is a cross-sectional view of a semiconductor substrate in accordance with some embodiments of the present disclosure.

FIG. 16 is a cross-sectional view of a semiconductor substrate 3g in accordance with some embodiments of the present disclosure. The semiconductor substrate 3g is similar to the semiconductor substrate 1 of FIG. 1, and certain details of same-numbered components are not described again with respect to FIG. 16. A heat dissipation structure 70 defines a gap 783 between a lower portion 74 and an upper portion 72. A height of the gap 783 may range from about 50 μm to about 100 μm, which may promote capillary effects. A working liquid 789 may flow between the gap 783.

Figure 17:
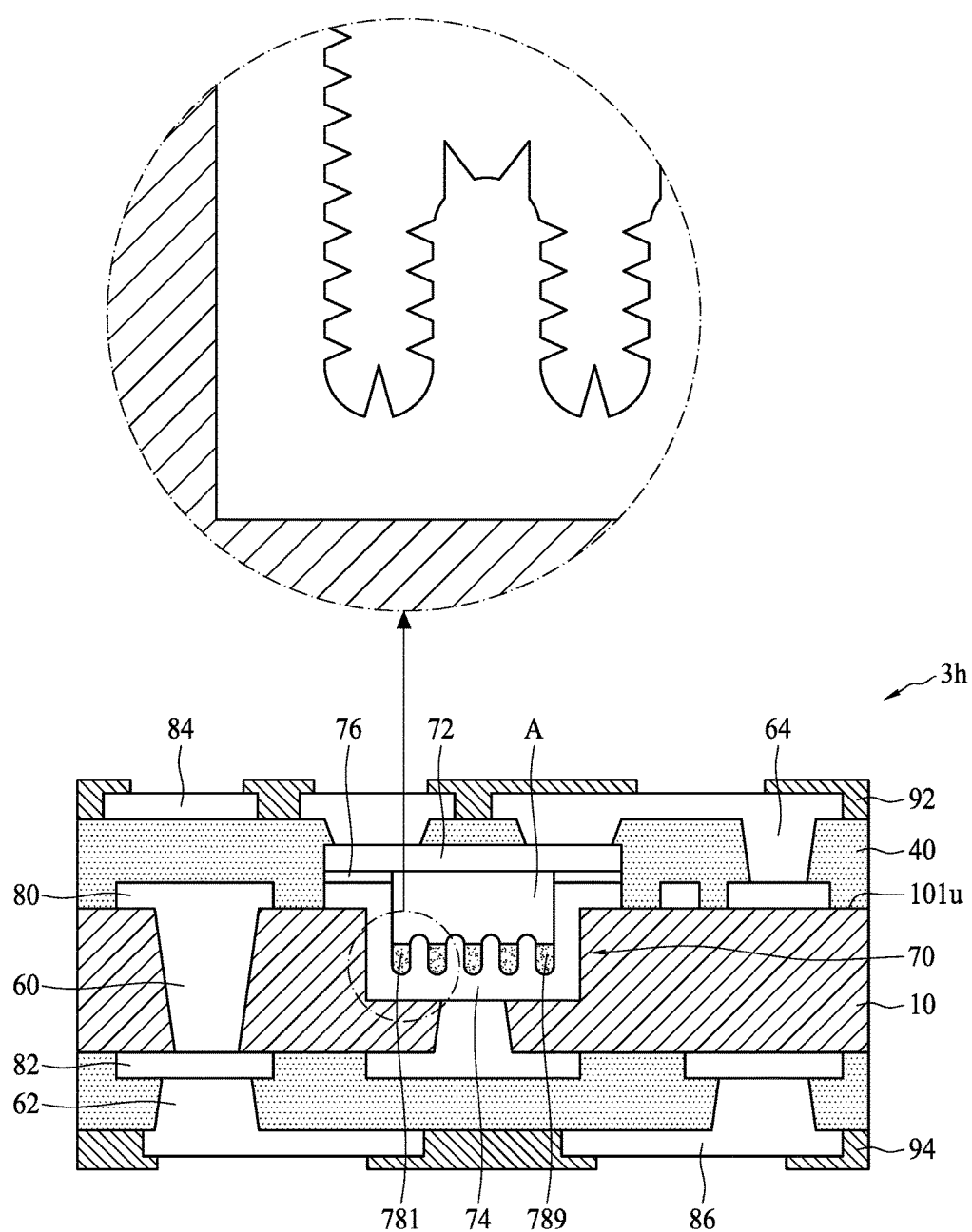
FIG. 17 is a cross-sectional view of a semiconductor substrate in accordance with some embodiments of the present disclosure.

FIG. 17 is a cross-sectional view of a semiconductor substrate 3h in accordance with some embodiments of the present disclosure. The semiconductor substrate 3h is similar to the semiconductor substrate 1 of FIG. 1, and certain details of same-numbered components are not described again with respect to FIG. 17. A surface of the trenches 781 may be non-planar. The surface of the trenches 781 may include multiple protrusions, which may promote capillary effects.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Thus, the term "approximately equal" in reference to two values can refer to a ratio of the two values being within a range between and inclusive of 0.9 and 1.1.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces or sides can be deemed to be aligned if a displacement between the two surfaces is no greater than 0.5 μm, no greater than 1 μm, no greater than 5 μm, no greater than 10 μm, or no greater than 15 μm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor substrate, comprising:
   a dielectric layer having a surface;
   a heat dissipation structure surrounded by the dielectric layer, the heat dissipation structure defining a space and including a liquid in the space; and
   a first patterned conductive layer disposed adjacent to the surface of the dielectric layer and thermally connected with the heat dissipation structure.

2. The semiconductor substrate of claim 1, wherein a boiling point of the liquid is no greater than 100° C.

3. The semiconductor substrate of claim 2, wherein the liquid includes at least one of water, an alcohol, a ketone or ammonia.

4. The semiconductor substrate of claim 3, wherein a pressure within the space is lower than 1 atm.

5. The semiconductor substrate of claim 4, wherein a surface within the space of the heat dissipation structure includes a capillary structure, a porous surface, a non-planar surface, or a rough surface.

6. The semiconductor substrate of claim 1, wherein the first patterned conductive layer and a portion of the heat dissipation structure are integrally formed as a monolithic structure.

7. The semiconductor substrate of claim 1, wherein the heat dissipation structure includes a heat absorbing end and a cooling end opposite to the heat absorbing end.

8. The semiconductor substrate of claim 7, further comprising a second patterned conductive layer including a via, wherein the second patterned conductive layer is thermally connected with the cooling end of the heat dissipation structure through the via of the second patterned conductive layer.

9. The semiconductor substrate of claim 8, further comprising a third patterned conductive layer including a via, wherein the third patterned conductive layer is thermally connected with the heat absorbing end of the heat dissipation structure through the via of the third patterned conductive layer.

10. The semiconductor substrate of claim 1, wherein the heat dissipation structure includes an upper portion, a lower portion and an adhesive layer disposed between the upper portion and the lower portion.

11. The semiconductor substrate of claim 10, wherein the heat dissipation structure includes a heat absorbing end and a cooling end opposite to the heat absorbing end, a surface of the lower portion within the space of the heat dissipation structure is a non-planar surface defining a plurality of first trenches, and the first trenches extend between the heat absorbing end and the cooling end.

12. The semiconductor substrate of claim 11, wherein a surface of the upper portion within the space of the heat dissipation structure defines a plurality of second trenches extending between the heat absorbing end and the cooling end.

13. The semiconductor substrate of claim 11, wherein the heat dissipation structure further includes a plurality of objects, wherein the objects are selected from copper (Cu) mesh, Cu fiber, sintered metal powder, or combinations of two or more thereof.

14. The semiconductor substrate of claim 1, wherein the heat dissipation structure further includes a plurality of objects, wherein the objects are selected from Cu mesh, Cu fiber, sintered metal powder, or combinations of two or more thereof.

15. A semiconductor package structure, comprising:
a first substrate, comprising:
a dielectric layer having a surface;
a heat dissipation structure surrounded by the dielectric layer, the heat dissipation structure defining a space and including a liquid in the space; and
a first patterned conductive layer disposed adjacent to the surface of the dielectric layer and thermally connected with the heat dissipation structure; and
a chip disposed on the first substrate and electrically and thermally connected to the first patterned conductive layer.

16. The semiconductor package structure of claim 15, wherein the chip includes an active layer facing the first substrate.

17. The semiconductor package structure of claim 16, wherein the first substrate further includes a second patterned conductive layer including a via, the heat dissipation structure includes a heat absorbing end and a cooling end opposite to the heat absorbing end, and the second patterned conductive layer is thermally connected with the cooling end of the heat dissipation structure through the via of the second patterned conductive layer.

18. The semiconductor package structure of claim 17, wherein the first substrate further includes a third patterned conductive layer including a via, and the third patterned conductive layer is thermally connected with the heat absorbing end of the heat dissipation structure through the via of the third patterned conductive layer.

19. The semiconductor package structure of claim 18, wherein the chip includes a first conductive connect, and the chip is electrically and thermally connected to the third patterned conductive layer through the first conductive connect.

20. The semiconductor package structure of claim 19, further comprising a pad and a second conductive connect disposed on the pad connected to the second patterned conductive layer.

21. The semiconductor package structure of claim 15, further comprising a second substrate disposed on the first substrate and electrically connected to the first substrate.

22. The semiconductor package structure of claim 21, further comprising an encapsulating material disposed between the first substrate, the chip and the second substrate.

23. The semiconductor package structure of claim 15, wherein the heat dissipation structure includes a heat absorbing end and a cooling end opposite to the heat absorbing end, a surface within the space of the heat dissipation structure is a non-planar surface defining a plurality of trenches, and the trenches extend between the heat absorbing end and the cooling end.

* * * * *